(12) United States Patent
Riess et al.

(10) Patent No.: US 8,062,971 B2
(45) Date of Patent: Nov. 22, 2011

(54) DUAL DAMASCENE PROCESS

(75) Inventors: Philipp Riess, Munich (DE); Erdem Kaltalioglu, Newburgh, NY (US); Hermann Wendt, Poughkeepsie, NY (US)

(73) Assignee: Infineon Technologies AG, Neubiberg (DE)

(*) Notice: Subject to any disclaimer, the term of this patent is extended or adjusted under 35 U.S.C. 154(b) by 26 days.

(21) Appl. No.: 12/051,644

(22) Filed: Mar. 19, 2008

(65) Prior Publication Data
US 2009/0239375 A1     Sep. 24, 2009

(51) Int. Cl.
*H01L 21/4763* (2006.01)

(52) U.S. Cl. ........ 438/638; 438/624; 438/625; 438/640; 438/702; 438/703; 438/717; 257/E21.232; 257/E21.233; 257/E21.579; 257/E21.585

(58) Field of Classification Search ........... 438/623, 438/625, 700, 620, 638, 624, 640, 702, 703, 438/717; 257/E21.232, E21.233, E21.579, 257/E21.585
See application file for complete search history.

(56) References Cited

U.S. PATENT DOCUMENTS

| | | | |
|---|---|---|---|
| 6,020,255 A * | 2/2000 | Tsai et al. | 438/618 |
| 6,297,149 B1 * | 10/2001 | Stamper | 438/637 |
| 6,300,235 B1 * | 10/2001 | Feldner et al. | 438/618 |
| 6,461,955 B1 * | 10/2002 | Tsu et al. | 438/618 |
| 6,627,557 B2 * | 9/2003 | Seta et al. | 438/717 |
| 7,192,868 B2 * | 3/2007 | Cotte et al. | 438/689 |
| 7,323,357 B2 * | 1/2008 | Seidl | 438/102 |
| 2004/0217087 A1 * | 11/2004 | Celii et al. | 216/67 |
| 2006/0024945 A1 * | 2/2006 | Kim et al. | 438/618 |
| 2006/0077702 A1 | 4/2006 | Sugimae et al. | |
| 2006/0216926 A1 * | 9/2006 | Ye et al. | 438/629 |
| 2009/0200683 A1 * | 8/2009 | Colburn et al. | 257/774 |

* cited by examiner

*Primary Examiner* — Julio J Maldonado
(74) *Attorney, Agent, or Firm* — Slater & Matsil, L.L.P.

(57) ABSTRACT

Structures and methods of forming metallization layers on a semiconductor component are disclosed. The method includes etching a metal line trench using a metal line mask, and etching a via trench using a via mask after etching the metal line trench. The via trench is etched only in regions common to both the metal line mask and the via mask.

26 Claims, 21 Drawing Sheets

DUAL DAMASCENE PROCESS

TECHNICAL FIELD

This invention relates generally to electronic devices, and more particularly to dual damascene processes.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Metallization layers are usually the top-most layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and the FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). The conductive lines in adjacent horizontal metallization layers may be connected vertically in predetermined places by vias formed between the conductive lines.

One of the challenges in semiconductor technology requires developing technologies that minimize process variations. Hence, a given technology is optimized in view of the process limitations. For example, metal lines are normally patterned wider near and above vias to minimize misalignment errors. However, such adjustments in the process are usually at some other expense. For example, wider metal lines result in a reduction in spacing between the metal lines, and can result in unwanted effects such as yield or performance loss.

Thus, what are needed in the art are cost effective ways of forming BEOL metallization without significant increase in costs or yield, performance and reliability loss.

SUMMARY OF THE INVENTION

These and other problems are generally solved or circumvented, and technical advantages are generally achieved, by embodiments of the present invention.

Embodiments of the invention include methods for forming metal and vias using a self aligned dual damascene process. In accordance with an embodiment of the present invention, the method includes etching a metal line trench using a metal line mask, and etching a via trench using a via mask after etching the metal line trench. The via trench is etched only in regions common to both the metal line mask and the via mask.

The foregoing has outlined rather broadly an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIG. 1*b* illustrates a top view of the vias and the metal lines, FIG. 1 *c* illustrates a magnified top view of the vias and the metal lines, FIG. 1*d* illustrates a cross sectional view, and FIG. 1*e* illustrates a cross sectional side view, in accordance with embodiments of the invention;

FIG. 2, which includes FIGS. 2*a*-2*v*, illustrates a method of fabrication a metal level and a via level in various stages of fabrication, in accordance with embodiments of the invention, wherein FIGS. 2*a*, 2*c*, 2*e*, 2*g*, 2*i*, 2*k*, 2*m*, 2*o*, 2*q*, 2*s*, and 2*u* illustrate cross section views of the interconnect structure and FIGS. 2*b*, 2*d*, 2*f*, 2*h*, 2*j*, 2*l*, 2*n*, 2*p*, 2*r*, 2*t*, and 2*v* illustrate top views of a metallization layer, in accordance with embodiments of the invention;

FIG. 4, which includes

FIG. 6, which includes

FIG. 7, which includes FIG. 8 illustrates a top view of a metal level, wherein FIG. 8*a* illustrates the top view of a metal level fabricated using embodiments of the invention, and wherein

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming interconnect metallization using damascene processes.

In conventional dual damascene processes, the via trench is first etched, followed by an etch to form trenches that form metal lines. Consequently, a key constraint in this process is the ability to overlay the metal line trench etch with the via trench etch. However, this is a challenging task and involves minimizing any wafer, as well as, mask alignment errors. Hence, in practice, this misalignment between the metal line trenches and via trenches is minimized by etching the metal lines wider than the vias, particularly on top of the vias. However, this wider metal line over the vias results in other problems. For example, the increased metal width reduces the spacing between neighboring or adjacent metal lines. Particularly, if this spacing decreases to a distance less than the design rule spacing, significant deleterious impacts may be observed. For example, the reduced spacing between metal lines may decrease the process margin during manufacturing and result in lower process yield. The increased metal width can also reduce performance (increased interconnect coupling) as well as increased reliability problems during product testing (e.g., dielectric breakdown such as TDDB) and operation.

In various embodiments, the invention avoids the problems arising from misalignment between metal lines and vias. In various embodiments, the present invention overcomes these limitations by forming the trench for via after forming the trench for metal lines. The trench for via is etched only in regions with a metal line trench overlying it. Further, in various embodiments, the invention achieves this by the use of a sacrificial material layer that is resistant to the via etch and protects other regions of the structures from being etched.

A structural embodiment of the invention will be first described using FIG. 1. Embodiments of the methods of fabrication will be described using FIGS. 2 and 4 and the flow charts of FIGS. 3 and 5. An application for minimizing misalignment in metal and via levels in accordance with an embodiment of the invention is discussed using FIG. 6. An embodiment of the invention illustrating a via mask used in the fabrication of the vias and metal lines is illustrated in FIG. 7. FIG. 8 compares the metallization fabricated using embodiments of the present invention to metallization fabricated using conventional processing.

Figure 1A:
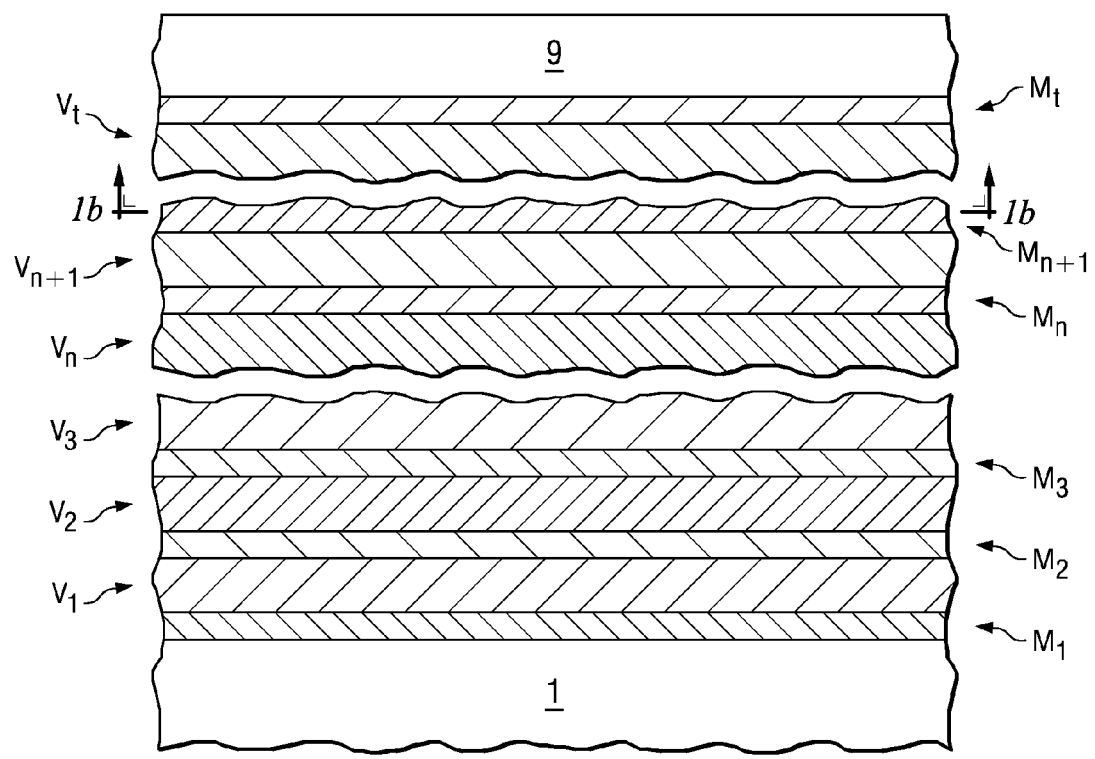
FIGS. 1*a*-1*e*, illustrates self aligned vias and metal lines fabricated in accordance with embodiments of the invention, wherein FIG. 1 *a* illustrates a cross sectional view.

An embodiment of the invention is illustrated in FIG. 1 which includes FIGS. 1a-1e. FIG. 1a illustrates a cross sectional of a semiconductor chip comprising multiple layers of metal and via levels disposed over a substrate 1. The substrate 1 comprises the active devices forming the active circuitry of the semiconductor chip. The active circuitry contains the active device regions and includes necessary transistors, resistors, capacitors, inductors or other components used to form integrated circuits. For example, active areas that include transistors (e.g., CMOS transistors) can be separated from one another by isolation regions (e.g., shallow trench isolation).

Next, metallization is formed over the active device regions to electrically contact and interconnect the active devices. The metallization and active device regions together form a complete functional integrated circuit. In other words, the electrical functions of the chip can be performed by the interconnected active circuitry.

FIG. 1a illustrates the metallization formed with metal levels $M_1$ to $M_t$ and corresponding via levels $V_1$ to $V_t$. The metal levels connect the various active devices on the chip, whereas, the via levels connect the different metal levels. In logic devices, the metallization may include many layers, e.g., nine or more, of copper or alternatively of other metals. In memory devices, such as DRAMs, the number of metal levels may be less and may be aluminum. The interconnect structure is typically covered with additional passivation layer 9 and suitable structure forming connections for packaging.

Figure 1B:
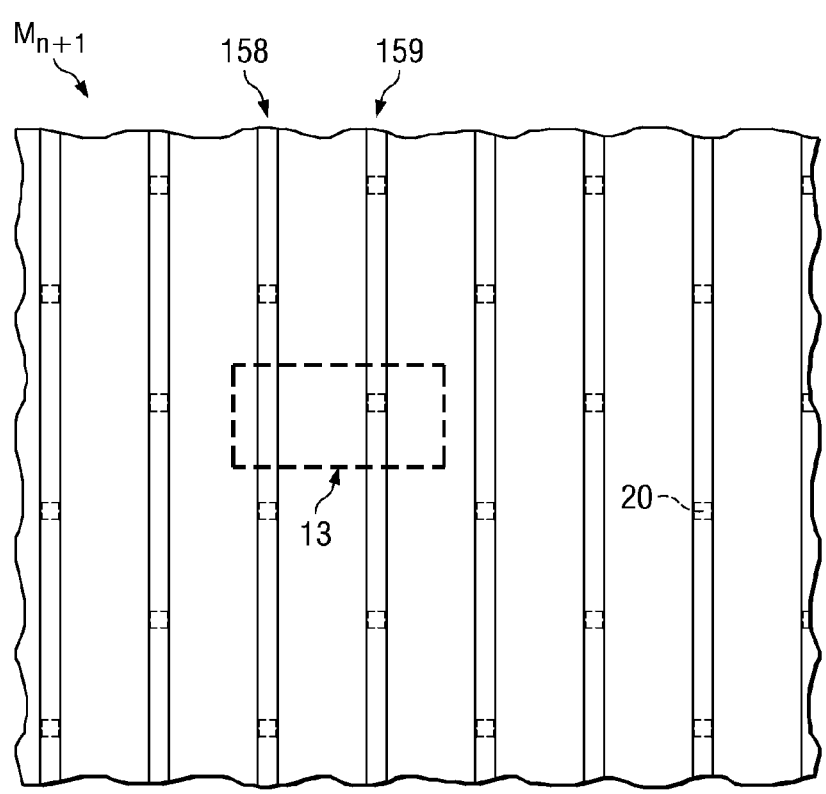
Figure 1C:
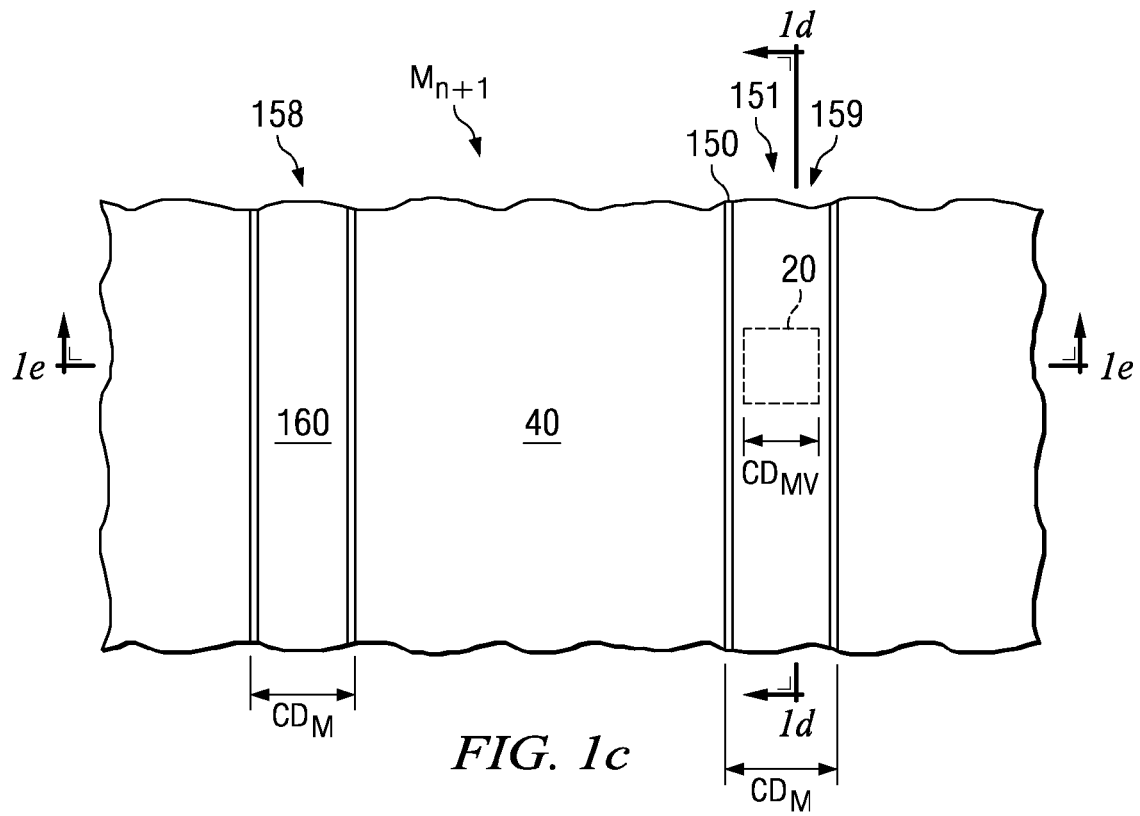

A top view cross section of a metal level $M_{n+1}$ is illustrated in FIG. 1b and FIG. 1c. FIG. 1c illustrates a magnified view of the metal lines of the region 13 in FIG. 1b. Each metal level comprises metal lines embedded in an inter-level dielectric layer. For example, the metal level $M_{n+1}$ comprises a second and third metal lines 158 and 159 embedded in a second inter-level dielectric layer 40. The second and third metal lines 158 and 159 comprise a metal 160. A first metal line 20 is disposed underneath the second inter-level dielectric layer 40 in a lower metal level $M_n$.

As illustrated in FIGS. 1b and 1c, the metal lines (for example, second and third metal lines 158 and 159) comprise a top critical dimension (width) that is constant across the metal level. Even in regions overlying vias (in FIGS. 1b and 1c vias overlie the first metal line 20 as they connect with the first metal line 20), the top critical dimension (width) of the metal line ($CD_{MV}$) is about the same as the top critical dimension (width) of the metal line in regions without any vias underneath ($CD_M$).

Figure 1D:
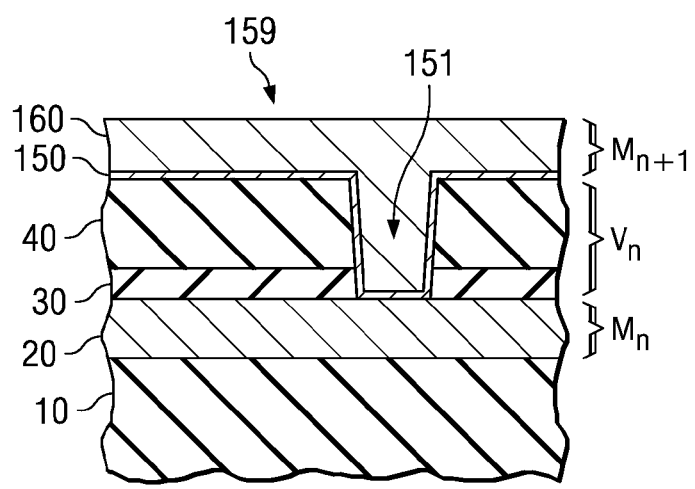
Figure 1E:
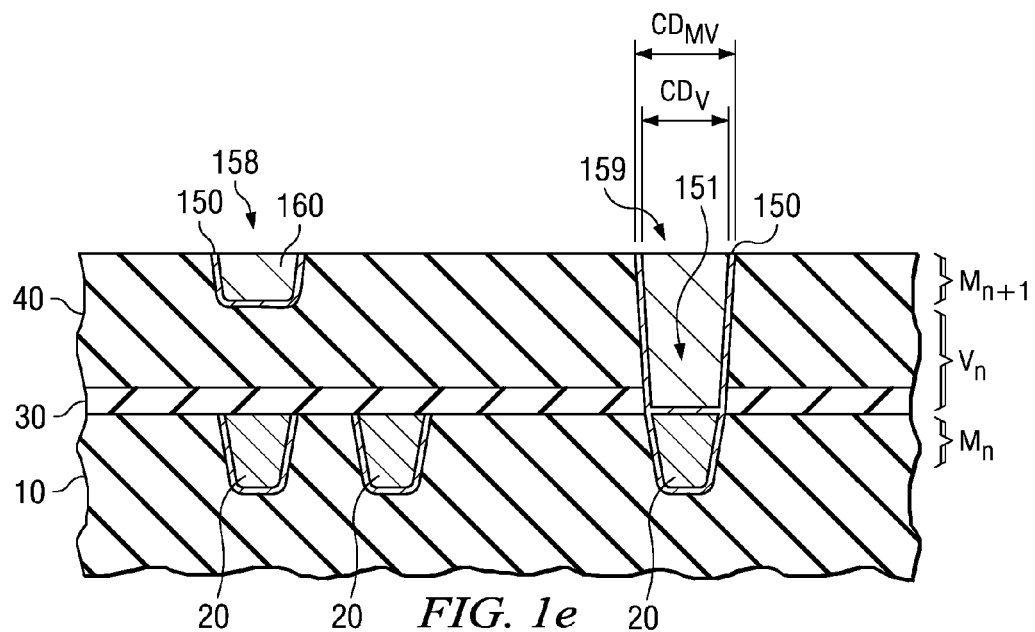

Vertical cross sectional views of the interconnect structure of FIG. 1c is illustrated in FIGS. 1d and 1e. FIGS. 1d and 1e illustrate a magnified cross section of the interconnect structure above the substrate 1, and hence illustrate a metal level $M_n$ disposed underneath the metal level $M_{n+1}$. The metal levels $M_n$ and $M_{n+1}$ are connected by an intermediate via level $V_n$. The vertical cross sectional views of FIGS. 1d and 1e illustrate the second and third metal lines 158 and 159 comprising the metal 160. The first metal line 20 is disposed in a first inter-level dielectric layer 10. The third metal line 159 is connected to the first metal line 20 through a via 151. The via 151 also comprises the metal 160. An etch stop layer 30 is disposed between the first and second inter-level dielectric layer 10 and 40.

Referring to FIG. 1e, the critical dimension of the vias (e.g., the top via CD) $CD_V$ is about the same as the top critical dimension (width) of the metal line over the vias ($CD_{MV}$. A method of fabrication of the structure will now be described using FIG. 2 and the flow chart of FIG. 3, in accordance with an embodiment of the invention. FIGS. 2 and 3 illustrate the formation of a metal level ($M_{n+1}$) and a via level ($V_n$) using a dual damascene process, in an embodiment of the invention. FIGS. 2a, 2c, 2e, 2g, 2i, 2k, 2m, 2o, 2q, 2s, and 2u illustrate cross section views of the interconnect structure and FIGS. 2b, 2d, 2f, 2h, 2j, 2l, 2n, 2p, 2r, 2t, and 2v illustrate top views of the interconnect structure during the fabrication process.

Figure 2A:
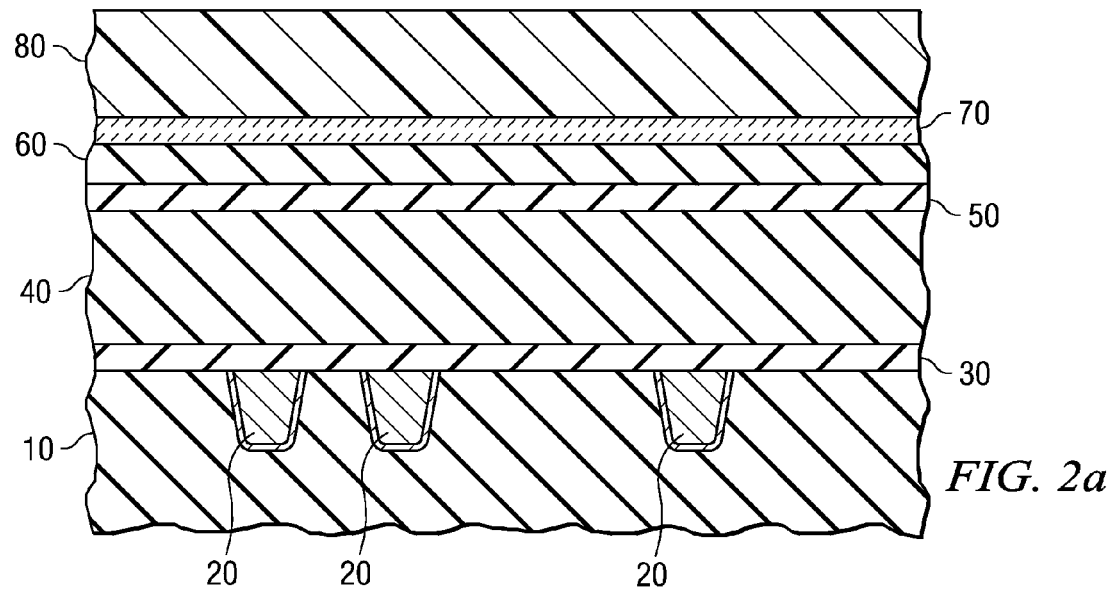
Figure 2B:
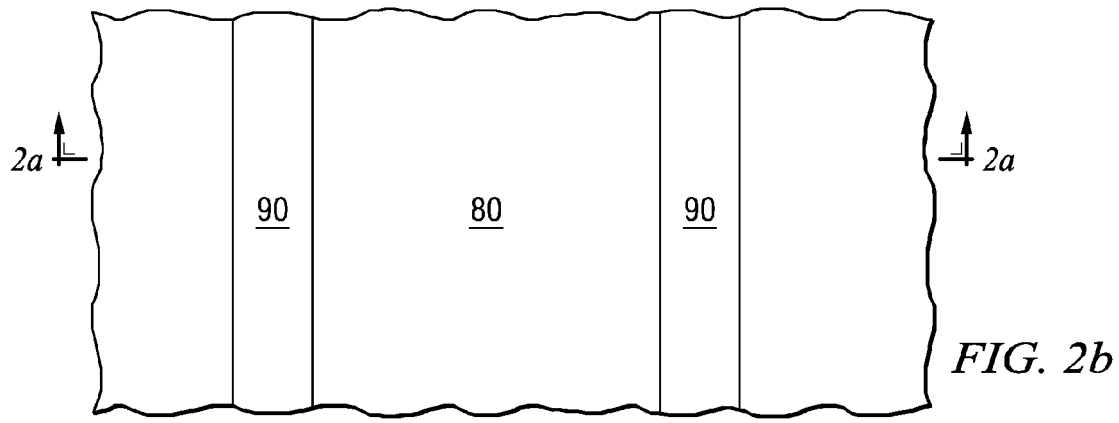
Figure 3:
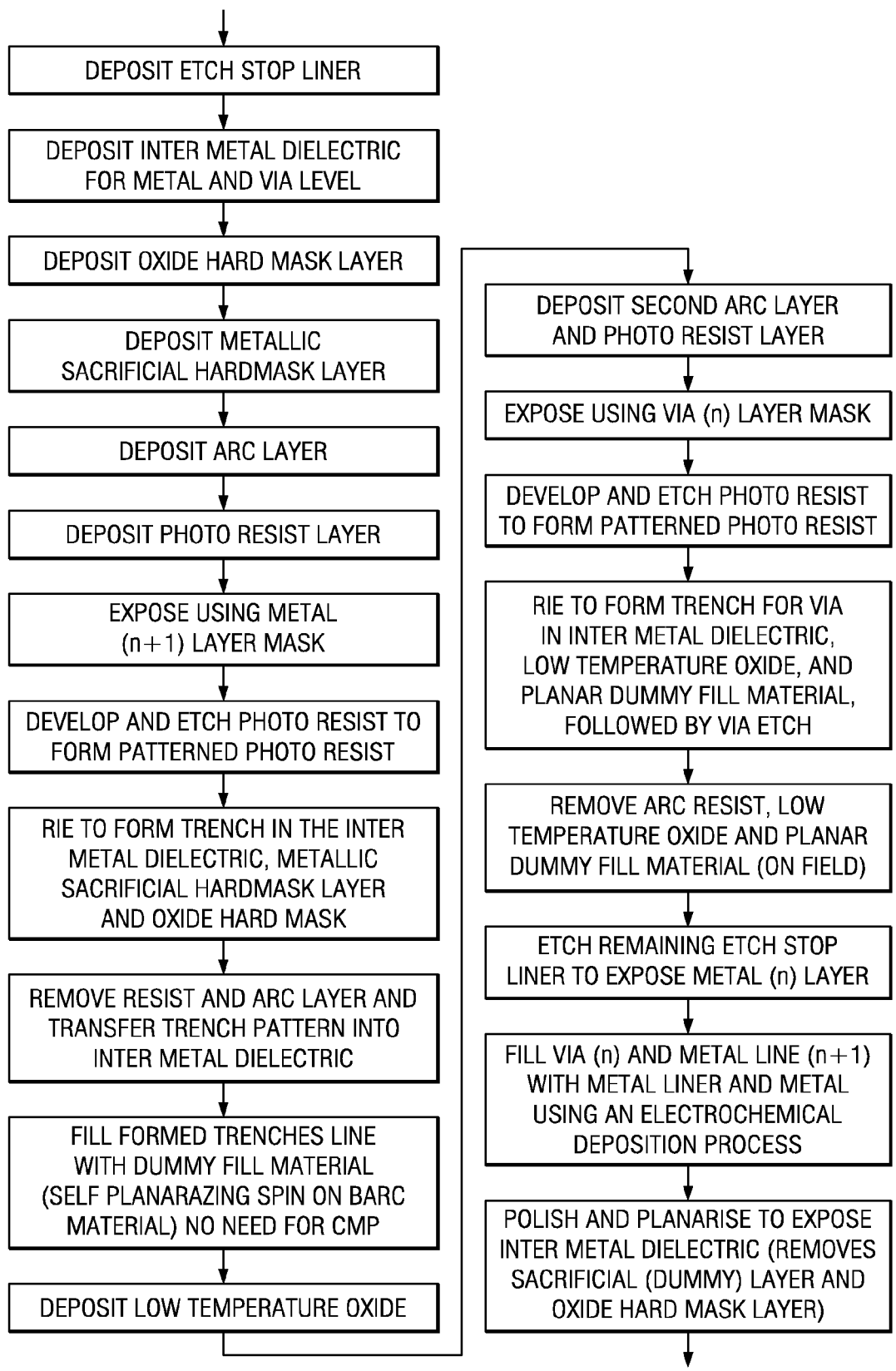
FIG. 3 illustrates a flow chart for formation of a metal and a via level illustrated in FIG. 2, in accordance with embodiments of the invention.

Referring first to FIGS. 2a and 2b, after formation of the first metal line 20 and the first inter-level dielectric 10, an etch stop liner 30 is deposited. The etch stop liner 30 is preferably a material comprising SiCHN such as nBLOK™ although, in other embodiments, other nitrides or other suitable materials may be used. Examples of etch stop liner 30 include materials such as silicon nitride (SiN), silicon oxynitride (SiON), silicon carbide (SiC) or silicon carbonitride (SiCN).

A second inter-level dielectric layer 40 is deposited over the etch stop liner 30. In various embodiments, the second inter-level dielectric layer 40 comprises insulating materials typically used in semiconductor manufacturing for inter-level dielectric (ILD) layers. The second inter-level dielectric layer 40 preferably comprises a low-k dielectric material such as a material selected from the group comprising silicon dioxide (SiO$_2$), fluorinated silicate glass (FSG), carbon doped glass (such as Black Diamond™, Coral™, Aurora™), organo silicate glass (OSG), hydrogen doped glass, porous carbon doped glass, porous silicon dioxide, polymeric dielectrics (e.g., FLARE™, SILK™), F-doped amorphous carbon, silicone based polymeric dielectrics such as hydrogen silsesquioxane (HSQ) and methylsilsesquioxane (MSQ). In some embodiments, the second inter-level dielectric layer 40 comprises ultra low-k materials such as porous silicate glass, xerogel, aerogel, nano clustered silica (NCS), porous organo silicate glass, porous organics. The second inter-level dielectric layer 40 may either be spin-on material or deposited by techniques such as CVD. Although alternatively, the second inter-level dielectric layer 40 may comprise other materials.

A first hard mask layer 50 is deposited over the second inter-level dielectric layer 40. The first hard mask layer 50 comprises SiO$_2$ such as tetra ethyl oxysilane (TEOS), silicon carbide (SiC) or carbon doped glass, but in various embodiments other materials may be used. A sacrificial material layer 60 is deposited over the first hard mask layer 50. The sacrificial material layer 60 preferably TiN or TaN. In some embodiments, the sacrificial material layer 60 comprises a metal (e.g., Ru, Hf, Ti, Ta, Ti, La, V, Nb, Pr, Dy, Sr, Gd, Mo); metal alloys (e.g., TiW); or nitrides (e.g., TiN, TaN, HfN, TaSiN, TiWN, NbN, MoN, TiAlN, MoSiN, HfSiN, TiSiN, or combinations of these); carbo-nitrides (e.g., TiCN, NbCN, HfCN, TaCN); silicides (e.g., TiSi$_2$, WSi$_2$).

Figure 2C:
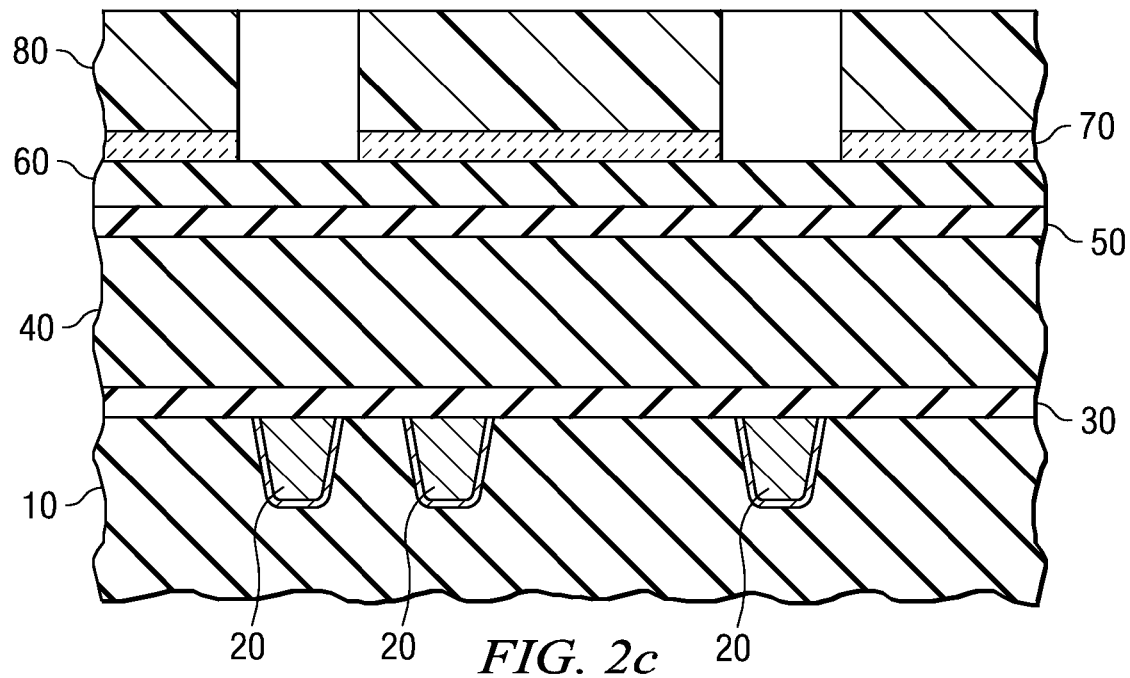
Figure 2D:
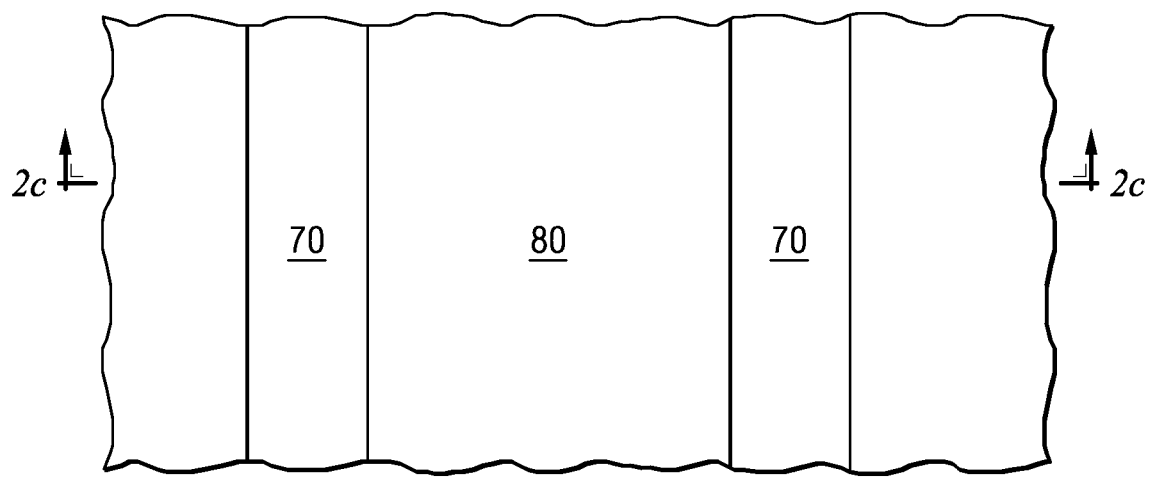

A first ARC layer 70 is deposited over the sacrificial material layer 60. A first photo resist 80 is deposited over the first anti reflective coating (ARC) layer 70. A metal line mask 90 (shown in FIG. 2b) is used to expose the first photo resist 80. The photo resist is next developed, for example, by a low temperature bake. As illustrated in FIGS. 2c and 2d, the exposed first photo resist 80 is etched to expose the first anti reflective coating (ARC) layer 70.

Figure 2E:
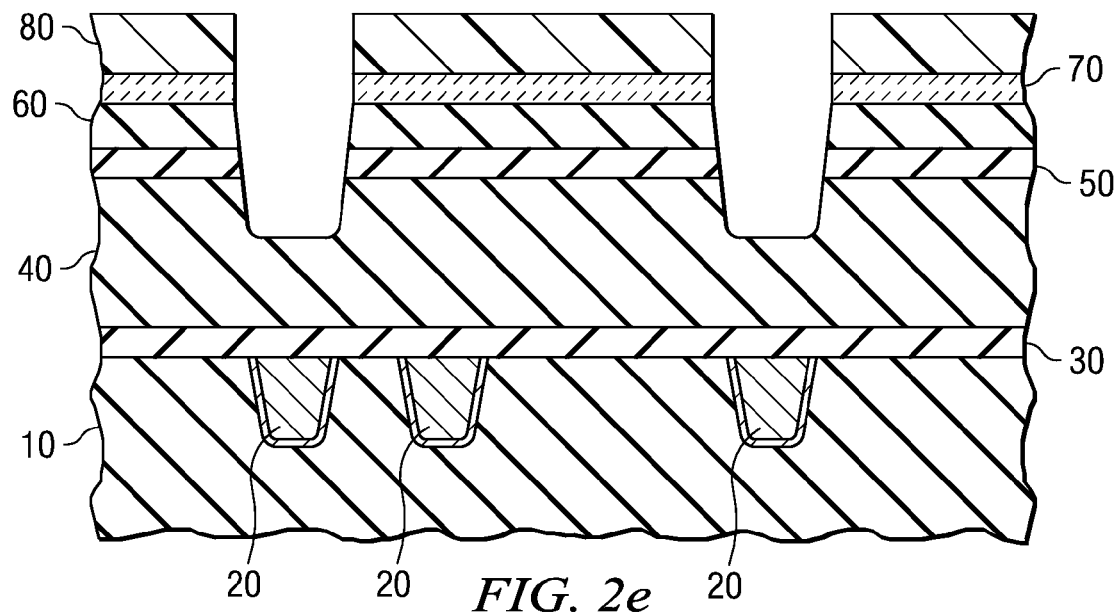
Figure 2F:
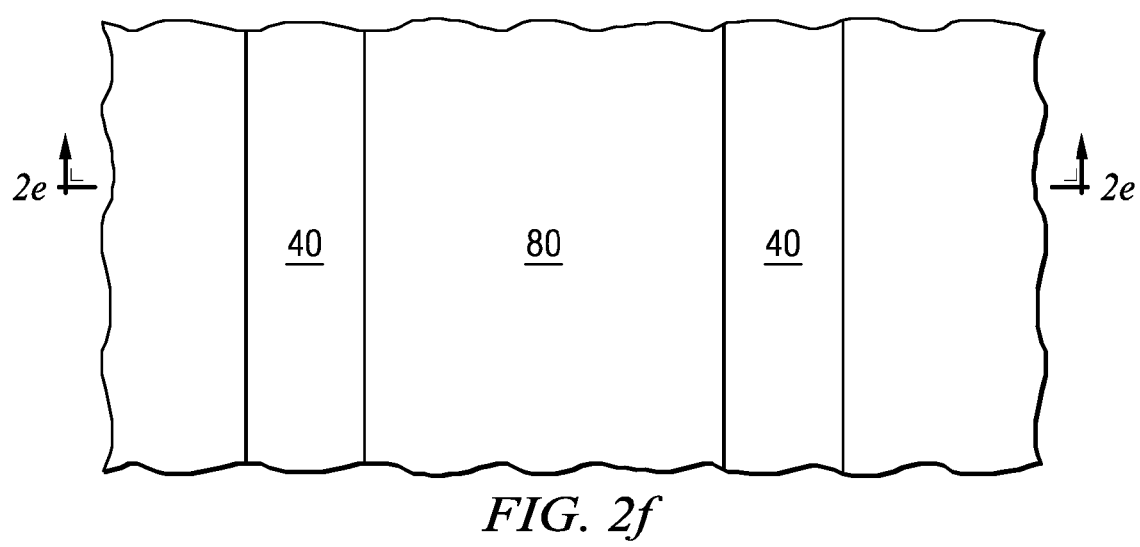

Referring next to FIGS. 2e and 2f, an anisotropic RIE process etches the first ARC layer 70, the sacrificial material layer 60, the first hard mask layer 50, and the second inter-level dielectric layer 40. As next illustrated in FIGS. 2g and 2h, the first photo resist 80 and the first ARC layer 70 are stripped off to form the trenches 75. The trenches 75 form the openings for forming metal lines. Some or all of the first photo resist 80 may be etched during the formation of the trenches 75.

A dummy fill material 105 is next used to fill the trenches 75 and forms the dummy filled trenches 100. The dummy fill material 105 comprises preferably a planarizing spin on material such as NFC™ manufactured by JSR, or other bottom anti-reflective coating materials (BARC). The dummy fill material 105 is overfilled to form a smooth surface. A second hard mask layer 110 is deposited over the dummy fill material 105, followed by a deposition of a second anti reflective coating (ARC) layer 120. The second hard mask layer 110 preferably comprises a low temperature oxide layer. A second photo resist 130 is deposited over the second ARC layer 120. FIG. 2j also illustrates the underlying dummy filled trenches 100.

Figure 2G:
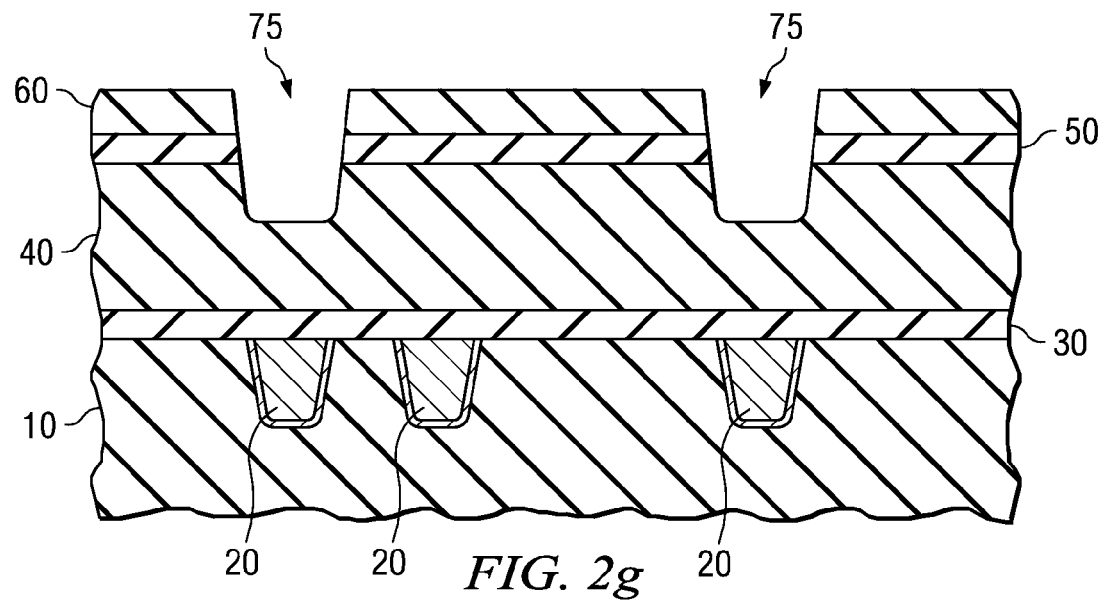
Figure 2H:
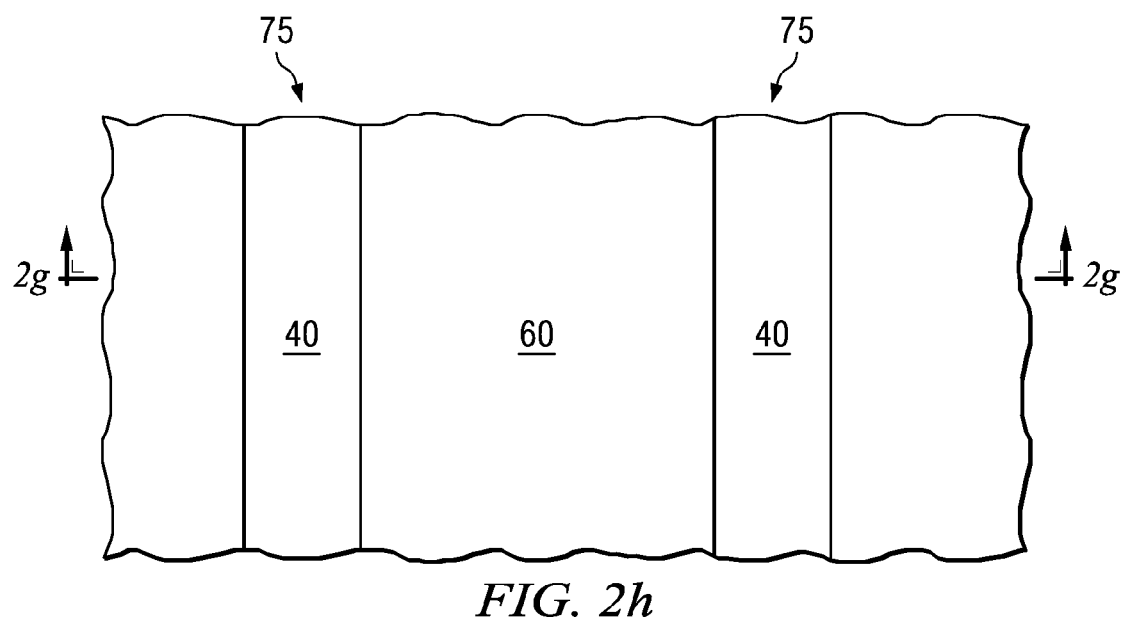
Figure 2I:
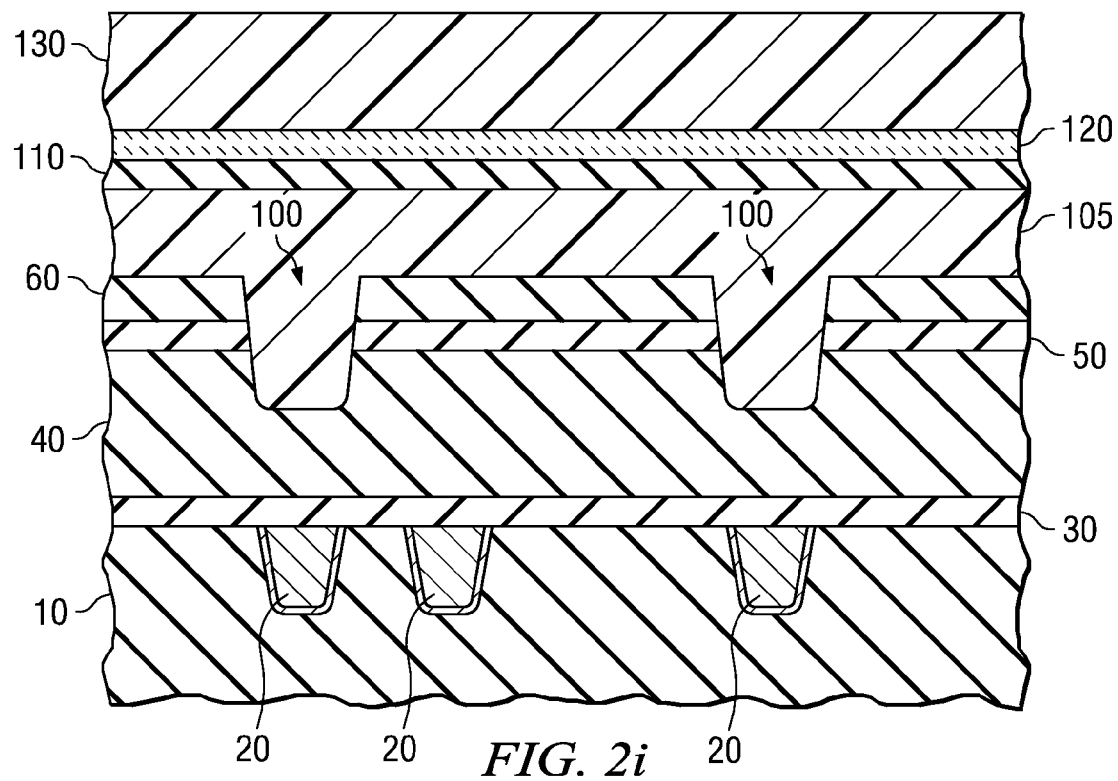
Figure 2J:
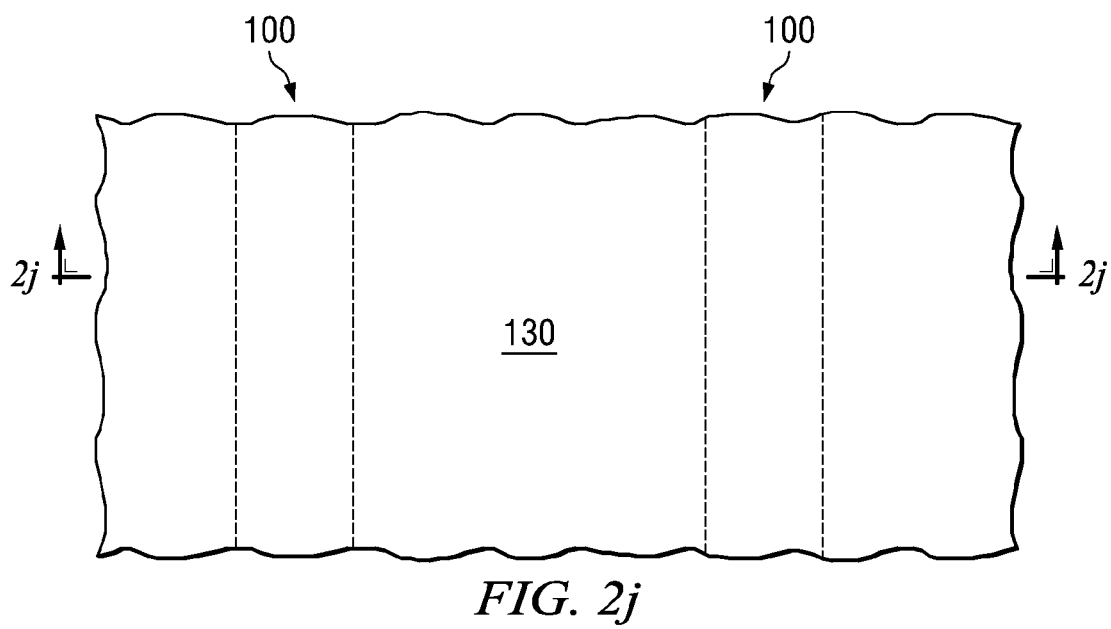
Figure 2K:
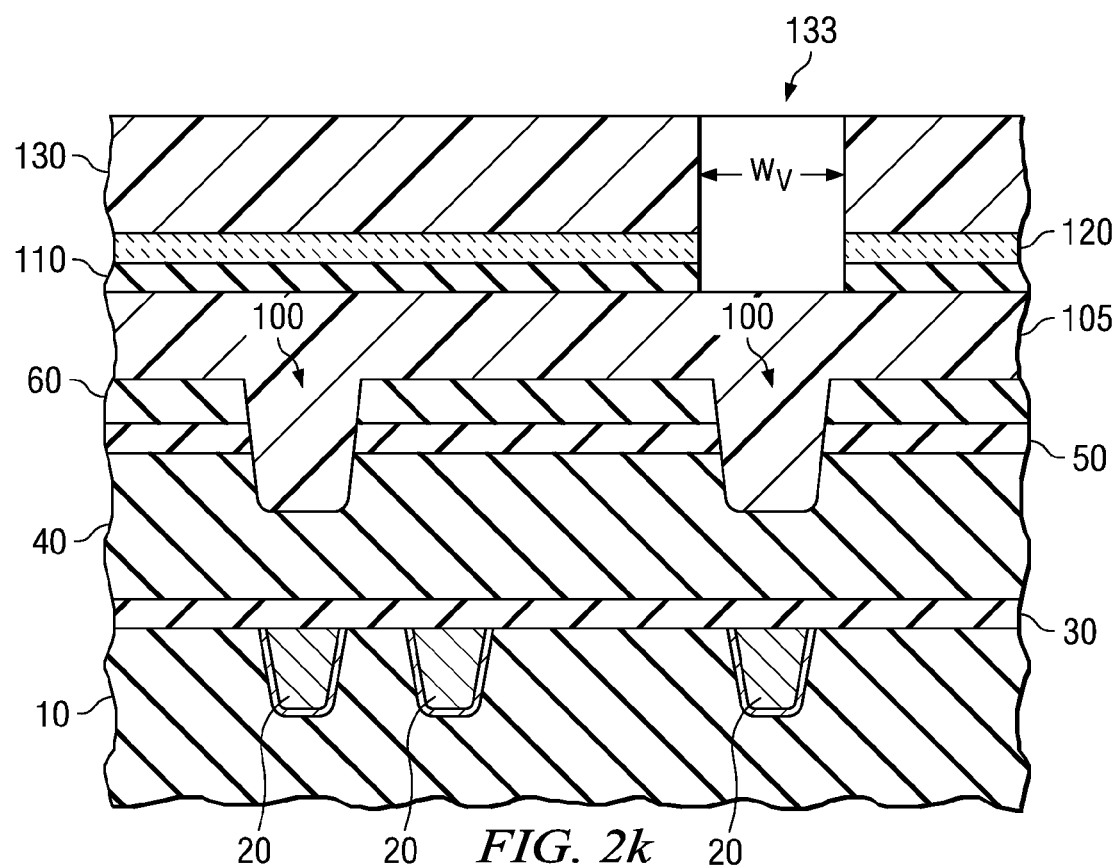
Figure 2L:
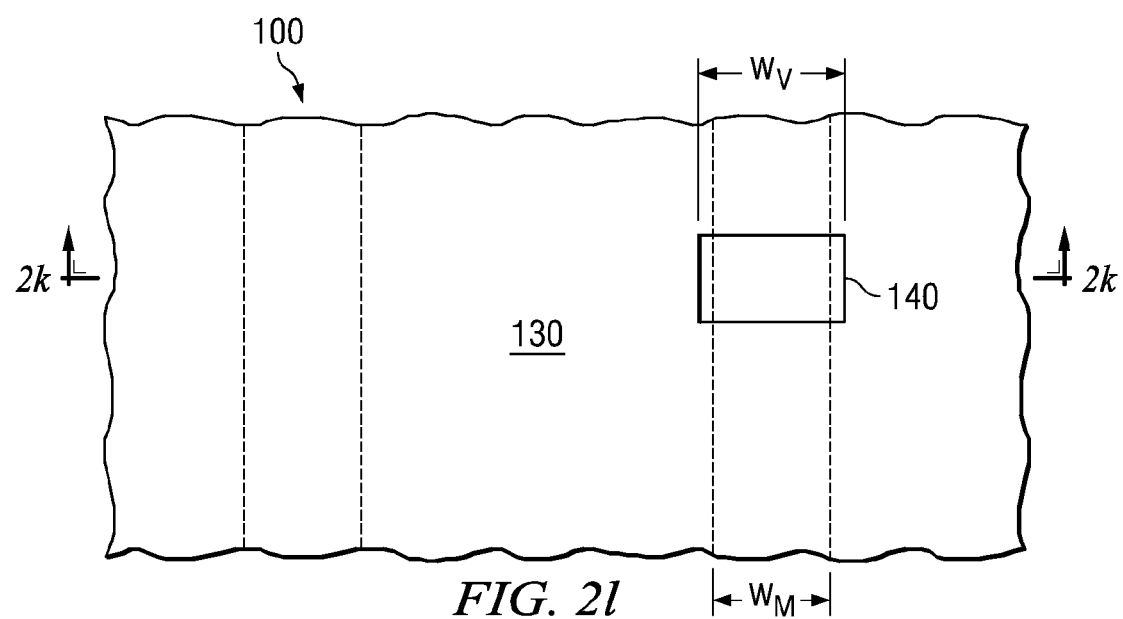

Referring next to FIGS. 2k and 2l, a via mask 140 is used to pattern the second photo resist 130. The via mask is preferably wider than the underlying dummy filled trenches 100, to minimize misalignment. For example, the width of the photo resist pattern 133 W$_V$ is greater than the top width of the trench W$_M$. However, in some embodiments this is not necessary.

Figure 2M:
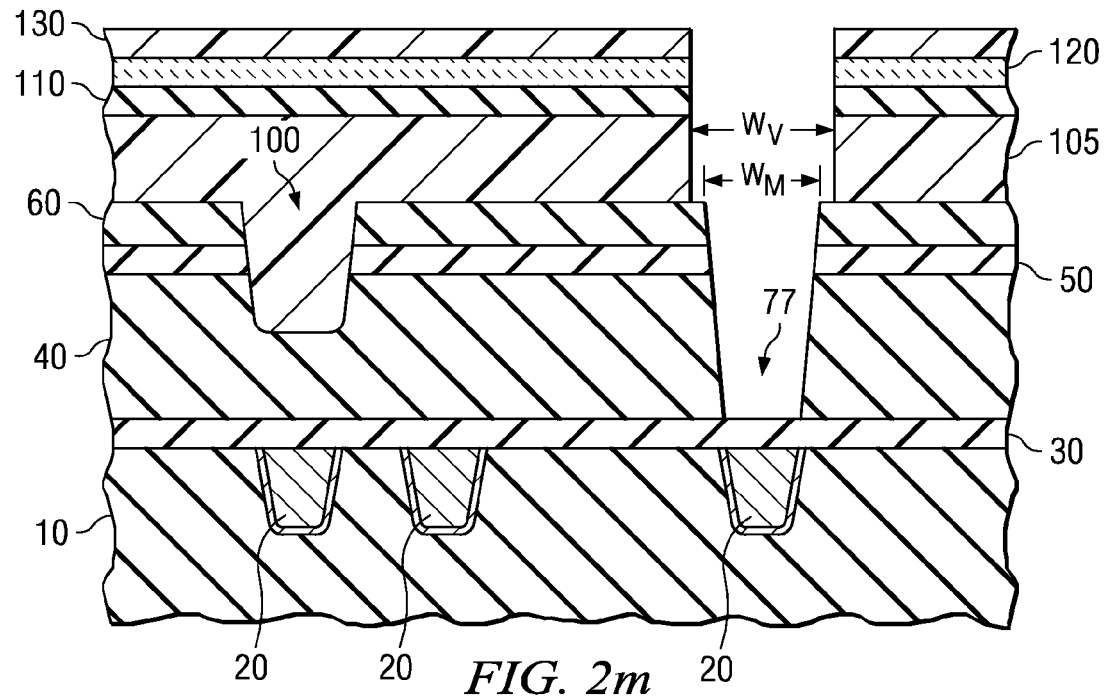
Figure 2N:
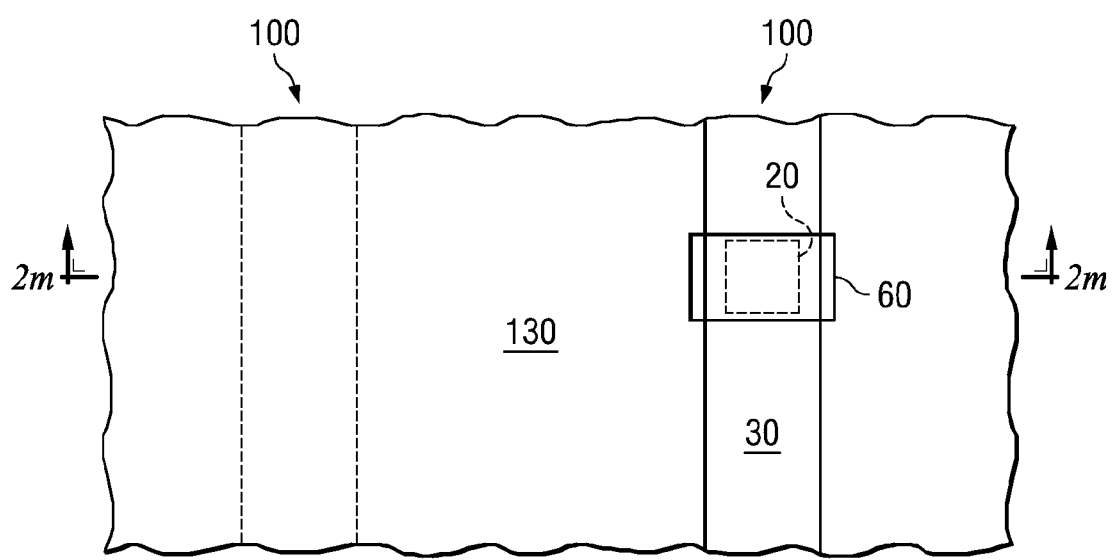

An anisotropic etch is used to etch through the second ARC layer 120, the second hard mask layer 110 and the dummy fill material 105. The anisotropic etch preferably comprises a reactive ion etch (RIE). In various embodiments, the second ARC layer 120 and the second hard mask layer 110 are etched using a CF$_4$/CHF$_3$ chemistry. Consequently, as illustrated in FIG. 2m, the etch proceeds by removing the dummy fill material 105 from the dummy filled trenches 100. The RIE progresses using a CO/N$_2$, Ar/O$_2$ or O$_2$/CO/N$_2$ chemistry to etch the dummy fill material 105 and second inter-level dielectric layer 40. The RIE chemistry may be selected differently to etch the dummy fill material 105 and the second inter-level dielectric layer 40. Other suitable etch chemistries may be used to etch the dummy fill material 105 and expose the underlying sacrificial material layer 60. The chemistry of the RIE process is selected to ensure a low etch rate of the sacrificial material layer 60. This low etch rate on the sacrificial material layer 60 protects not only the sacrificial material layer 60, but also the layers underneath it. For example, if the sacrificial material layer 60 comprises TiN, a plasma etch chemistry comprising C$_4$F$_8$ is selected to minimize etching of the sacrificial material layer 60. In various embodiments, the ratio of the etch rate of the sacrificial material layer 60 to the etch rate of the second inter-level dielectric layer 40 is less than about 1:5, and preferably less than about 1:10. For example, in one embodiment the etch chemistry is selected such that the ratio of the etch rate of the sacrificial material layer 60 to the etch rate of the second inter-level dielectric layer 40 is about 1:20. The top view in FIG. 2n illustrates the rim comprising the sacrificial material layer 60 formed around the trench. The anisotropic etch is stopped on the etch stop liner 30 after etching through the second inter-level dielectric layer 40. It is noted that although the via mask 140 is wider than the top width of the trench W$_M$, the via is etched only under the dummy filled trenches 100.

Figure 2O:
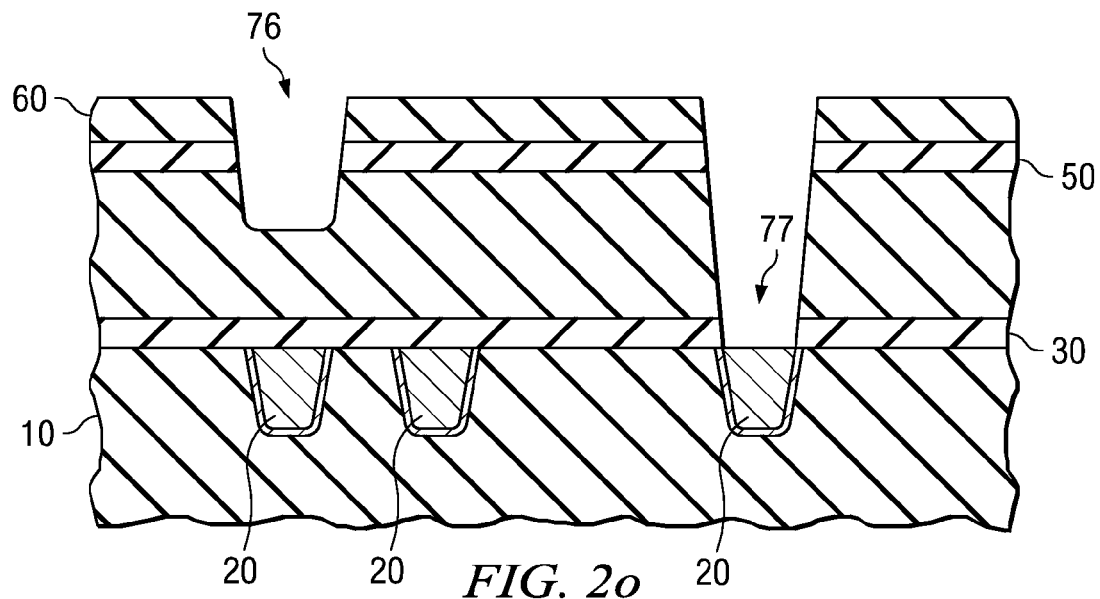
Figure 2P:
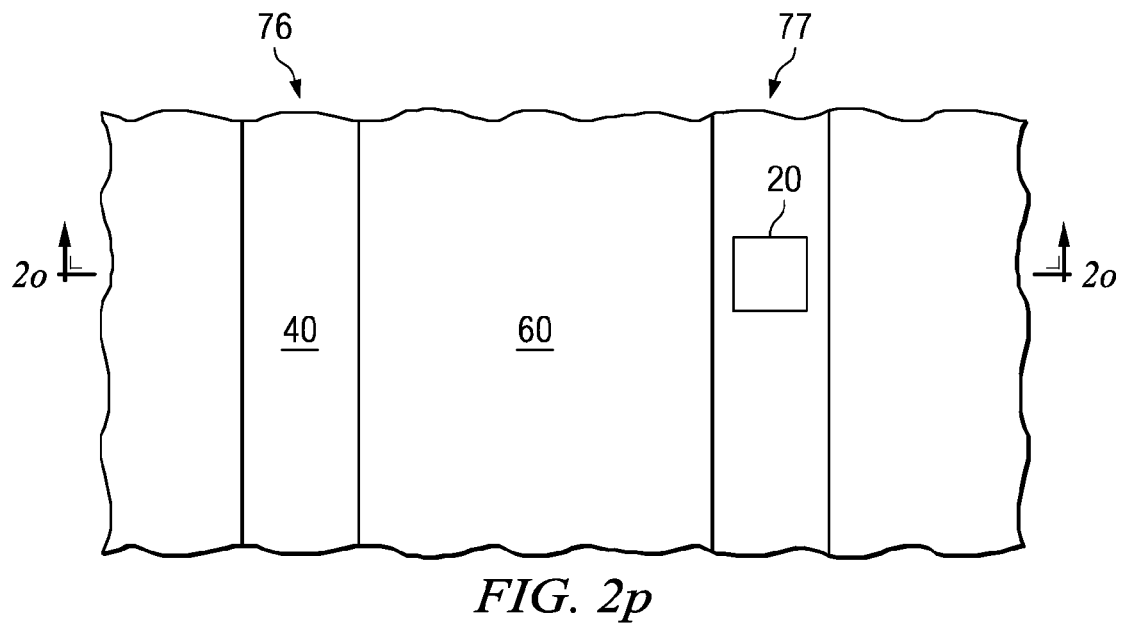

Next, as illustrated in FIGS. 2o and 2p, any remaining second photo resist 130, the second ARC layer 120, and the second hard mask layer 110 are etched and removed to expose the sacrificial material layer 60. The dummy fill material 105 is next etched and removed thus opening the metal line trench 76 and via trench 77 or via opening. The sacrificial material layer 60 protects the etching of the first hard mask layer 50 during the etching process for the removal of the dummy fill material 105. The etch stop liner 30 is next etched exposing the first metal line 20. In some embodiments, the etch stop liner 30 is etched in a CF$_4$/CO or Ar/CO$_2$/CF$_4$/CH$_2$F$_2$ etch chemistry.

Figure 2Q:
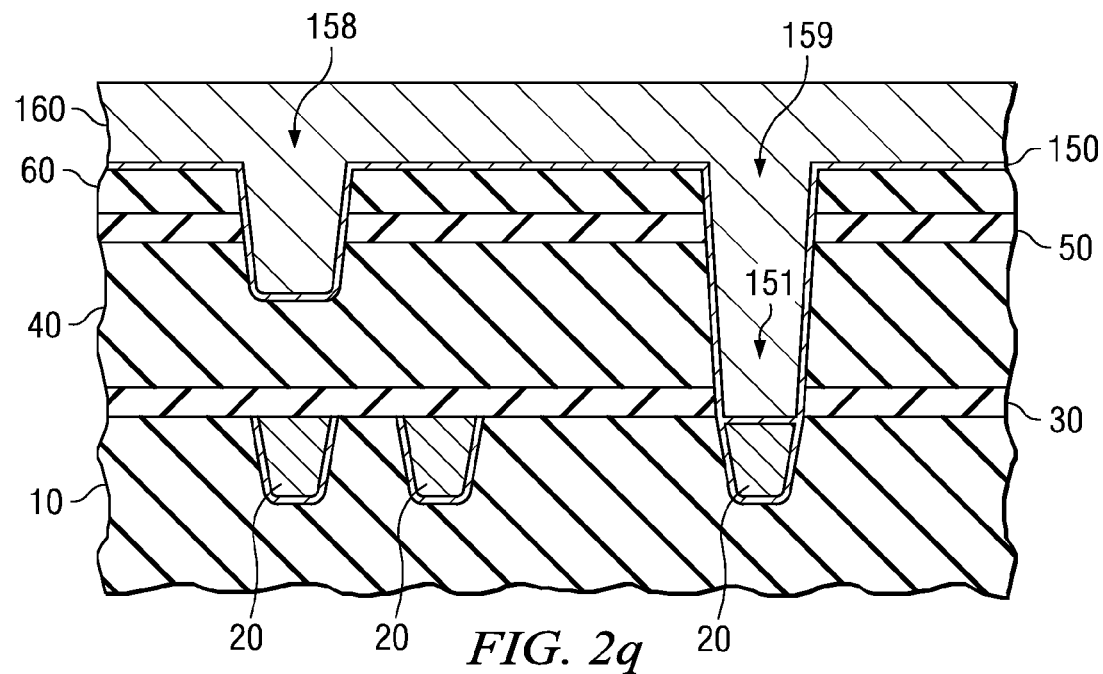
Figure 2R:
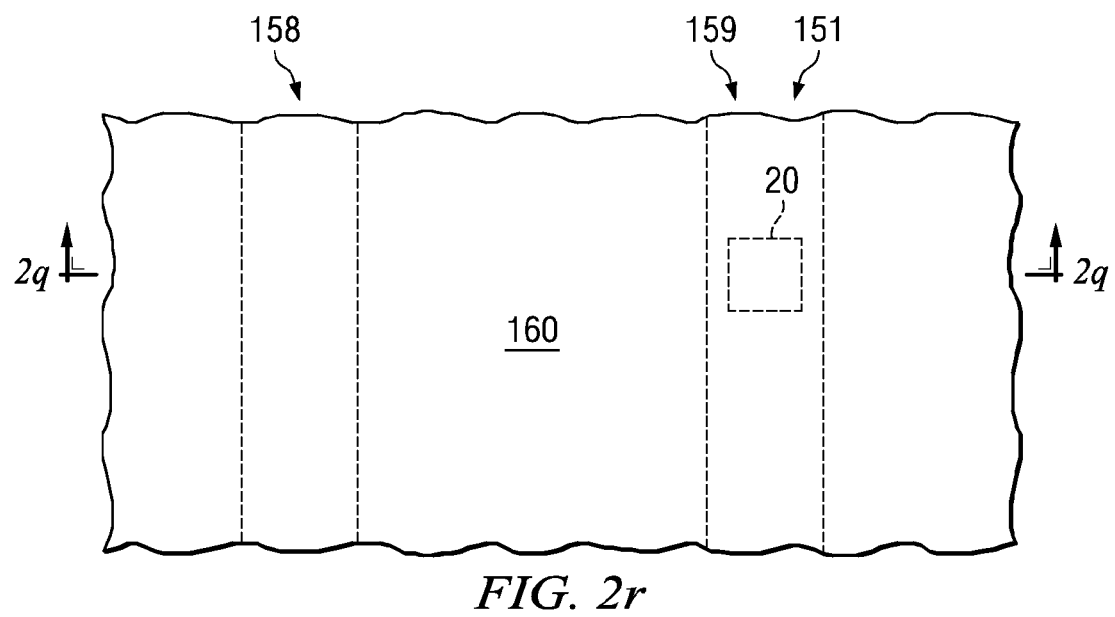
Figure 2S:
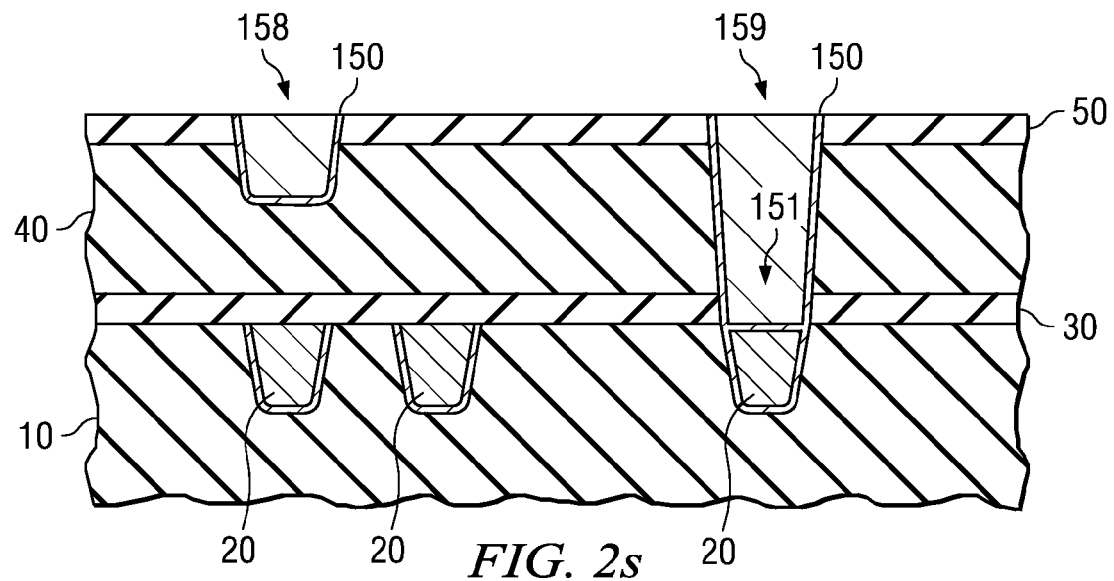
Figure 2T:
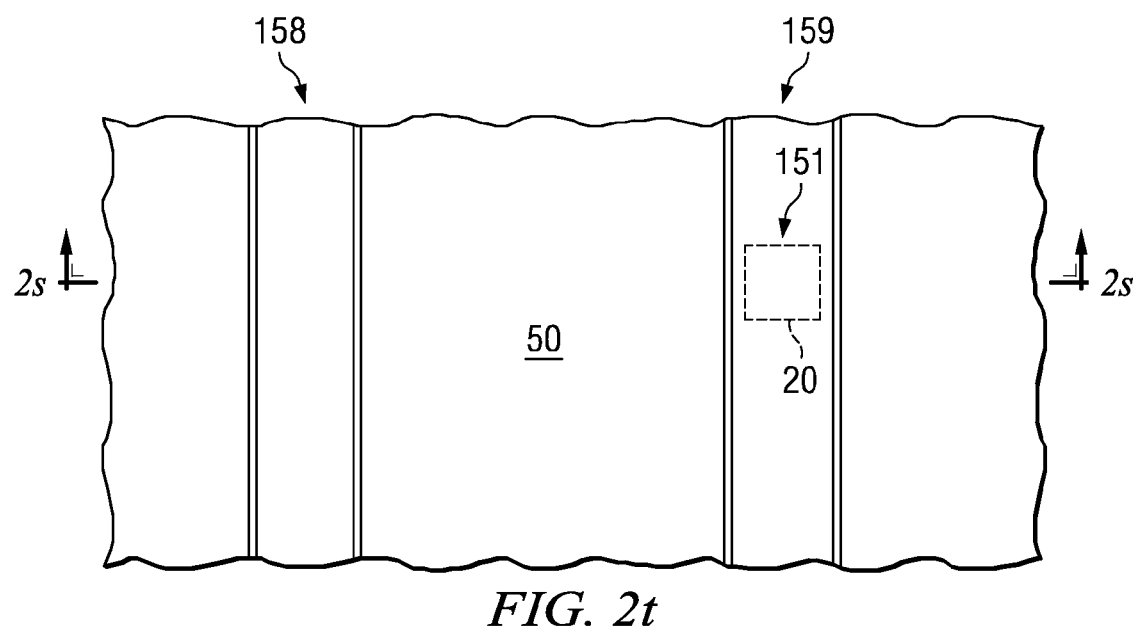
Figure 2U:
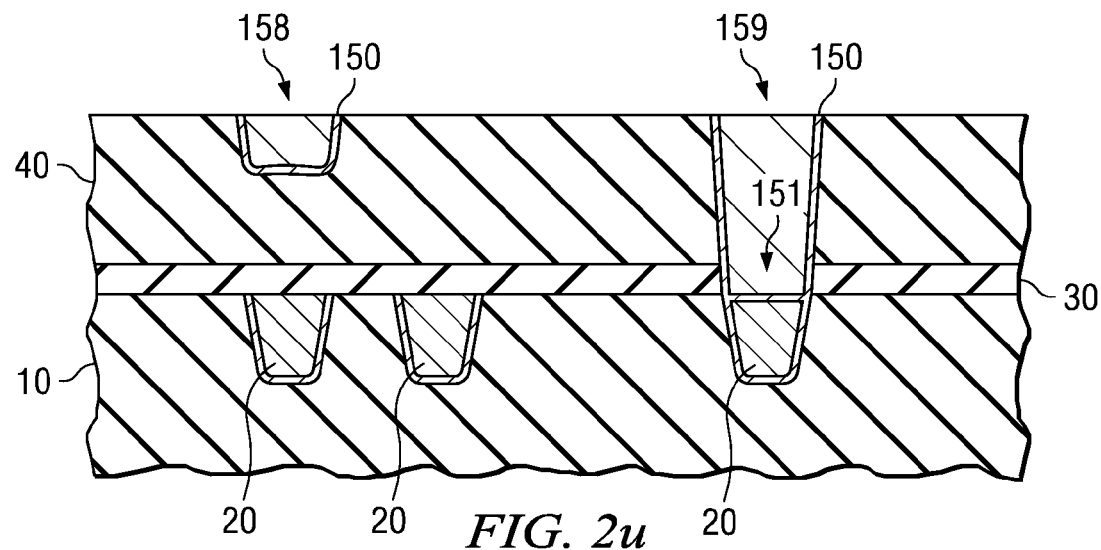
Figure 2V:
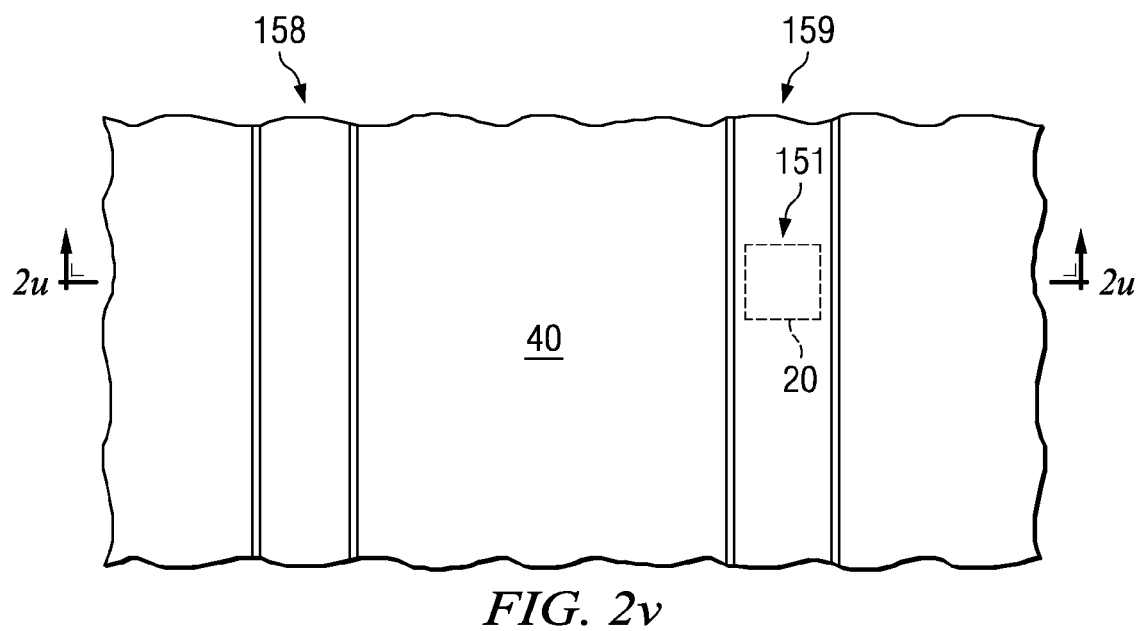

A metal liner 150 is deposited into the metal line and via trenches 76 and 77, and over a top surface of the sacrificial material layer 60, by a suitable process such as PVD, sputtering, CVD (FIG. 2q). The metal liner 150 comprises a diffusion barrier metal such as titanium nitride, titanium, tantalum, tantalum nitride, tungsten nitride, tungsten carbonitride (WCN), ruthenium or other suitable conductive nitrides or oxides. A metal 160 is deposited over the metal liner 150 (FIGS. 2q and 2r). The metal 160 is deposited by an electro chemical deposition process. The metal 160 preferably comprises copper or its alloys, although in some embodiments it may comprise aluminum, gold, tungsten, and combinations thereof or other suitable conductive materials. The metal 160 and metal liner 150 form the second and third metal lines 158 and 159, as well as via 151 connecting the first metal line 20. As illustrated in FIGS. 2s and 2t, the metal 160 is planarised and polished using a suitable process such as chemical mechanical polishing (CMP). The CMP process also removes the sacrificial material layer 60 and first hard mask layer 50. However, in various embodiments, the first hard mask layer 50 is not removed completely and used as a liner to the second inter level dielectric layer 40. FIGS. 2u and 2v also illustrate the formed second and third metal lines 158 and 159 and the via 151.

Figure 4A:
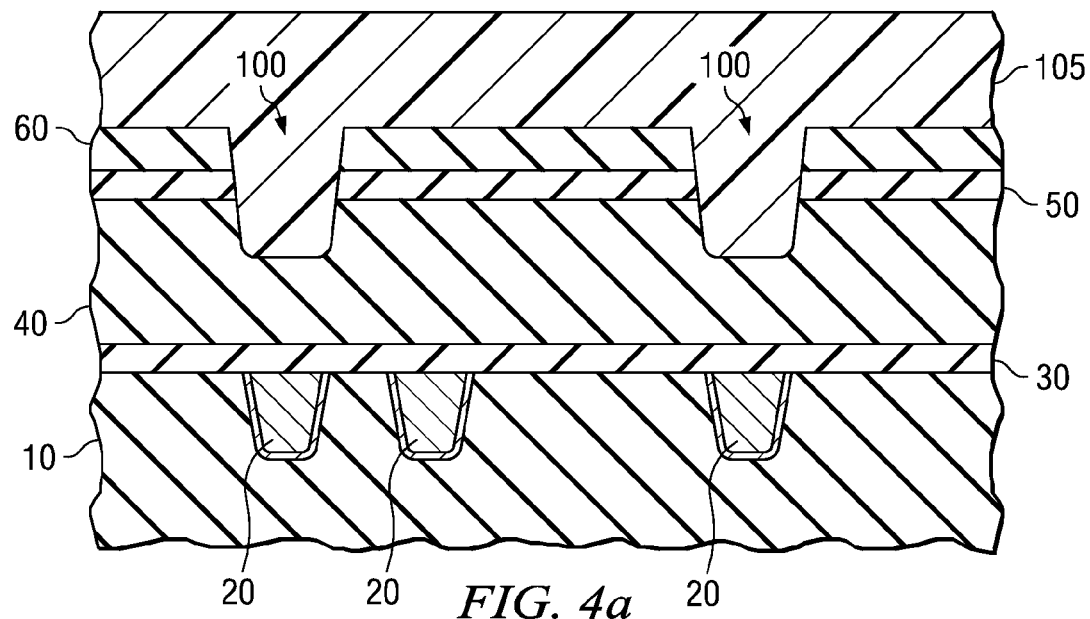
FIGS. 4*a*-4*f*, illustrates cross sectional views of a metallization layer in a method for fabrication of a metal (n+1) level and a via (n) level in various stages of processing, in accordance with embodiments of the invention.
Figure 4B:
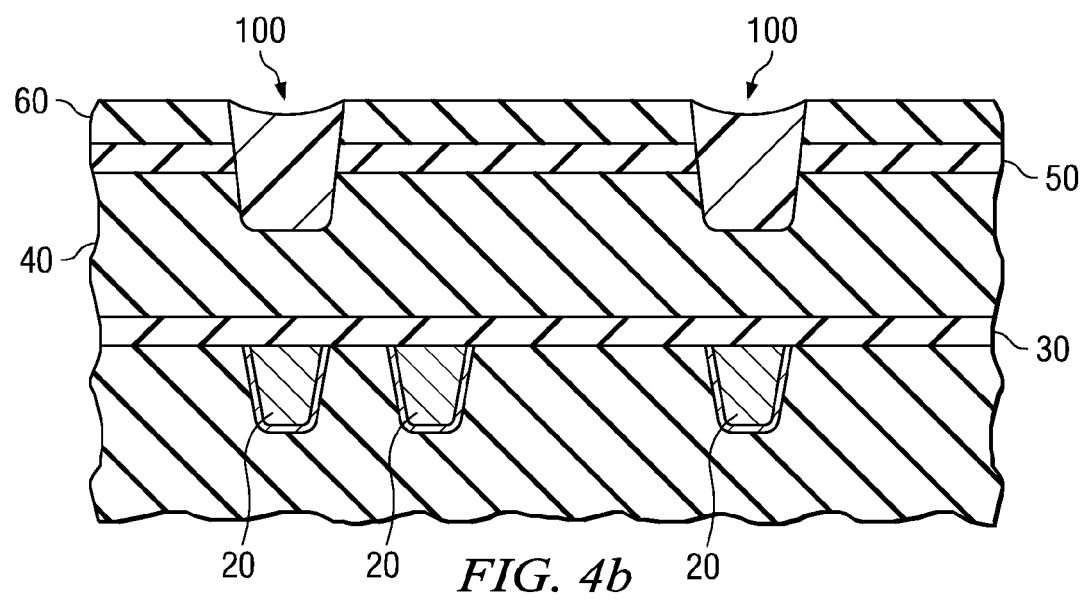
Figure 4C:
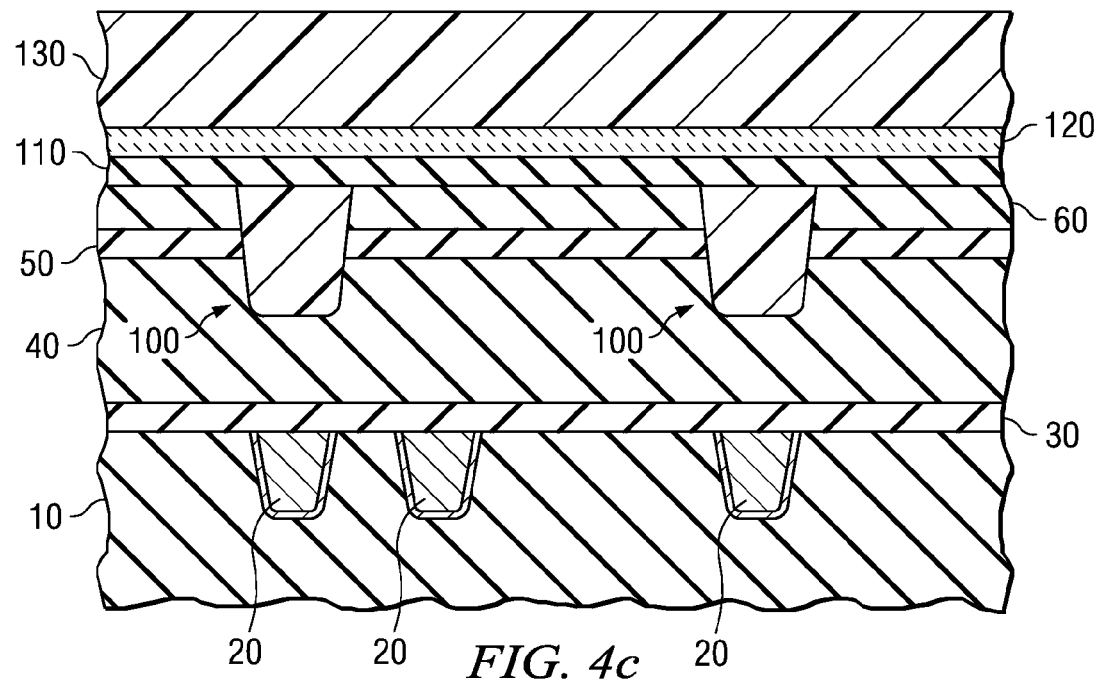
Figure 4D:
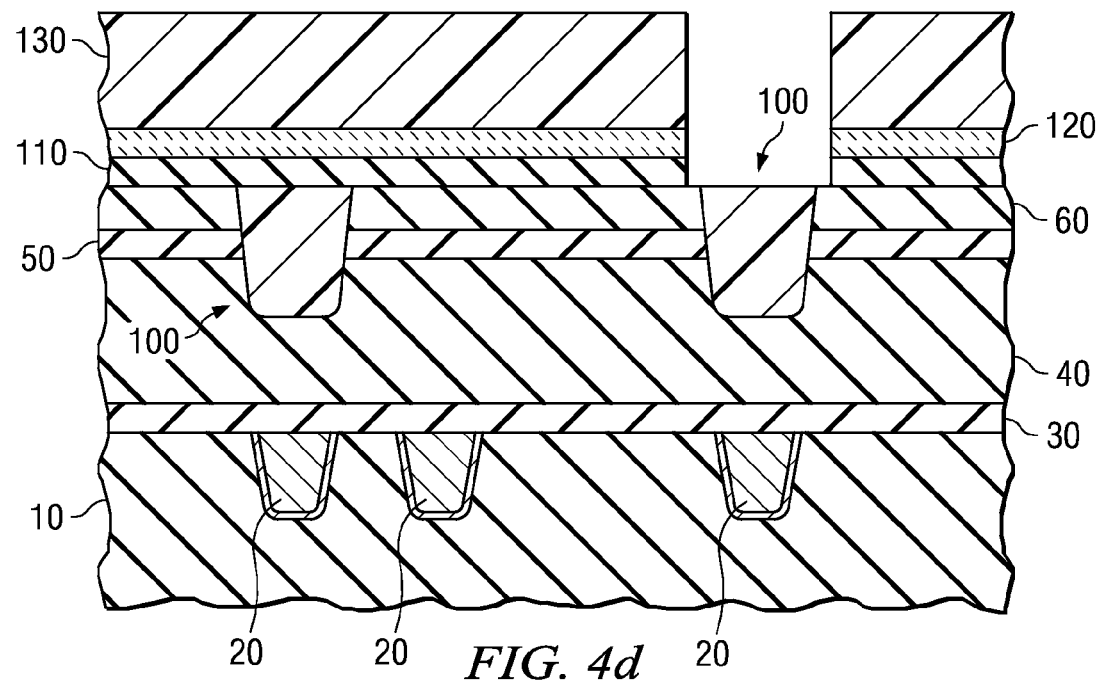
Figure 4E:
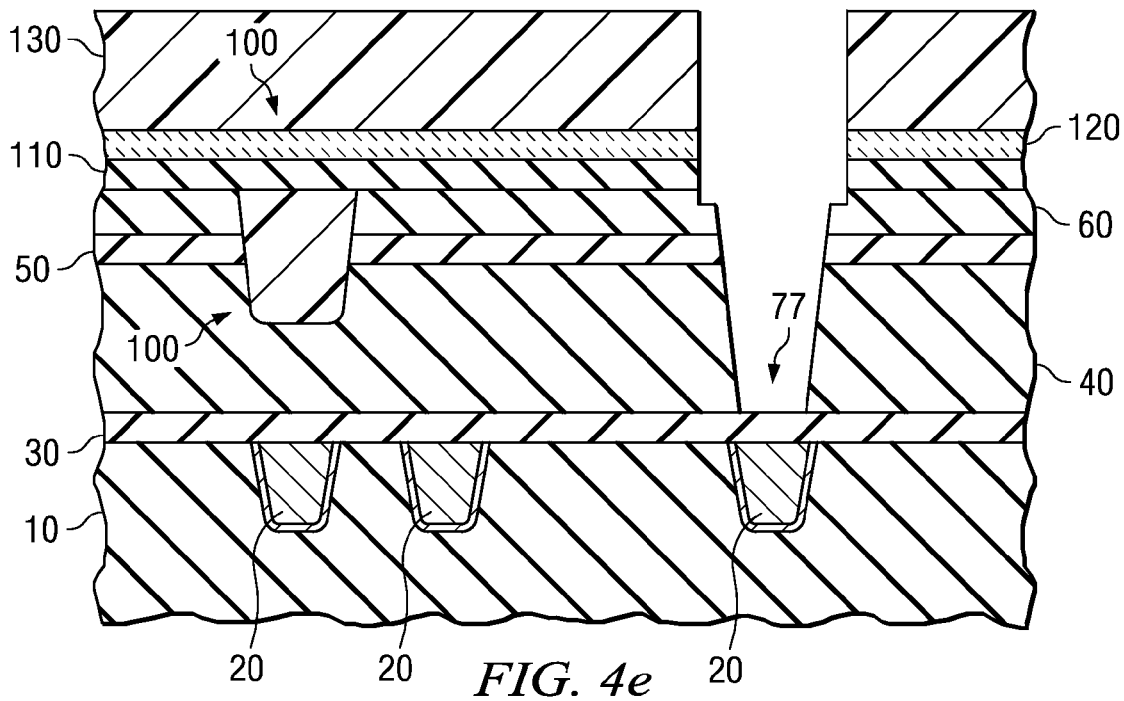
Figure 4F:
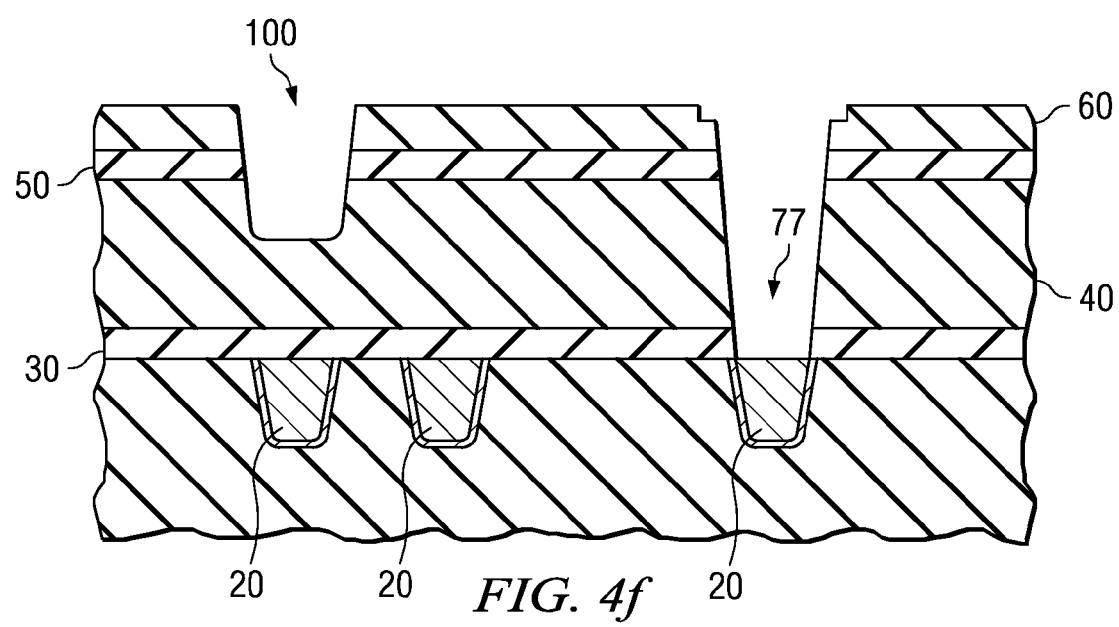
Figure 5:
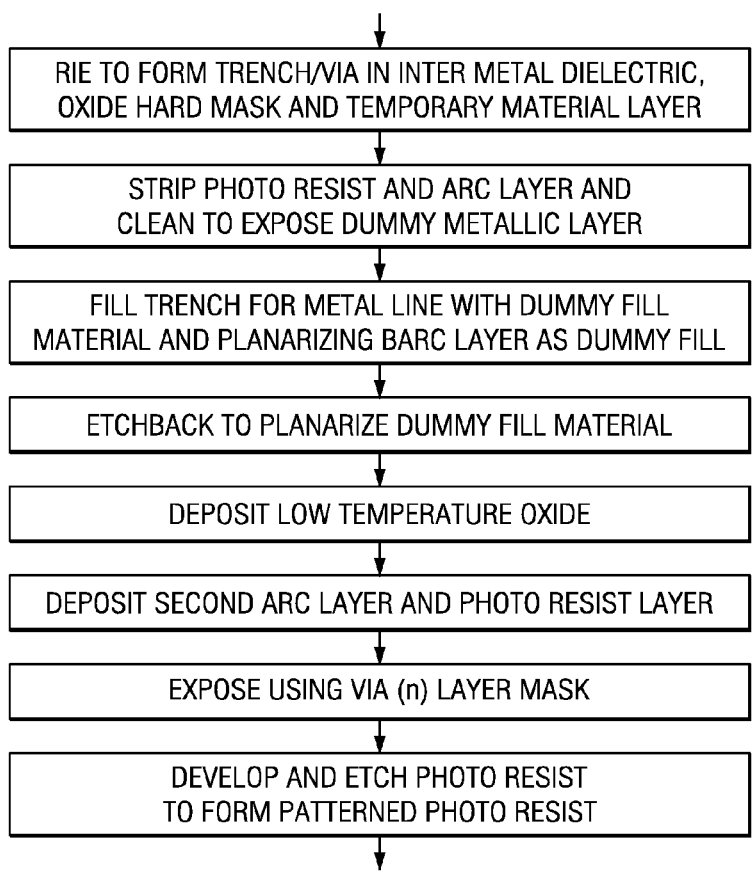
FIG. 5 illustrates a flow chart for formation of a metal and a via (n) level illustrated in FIG. 4, in accordance with embodiments of the invention.

An embodiment for fabrication of a metal level ($M_{n+1}$) and a via level ($V_n$) using a dual damascene process will be described using FIG. 4 and the flow chart of FIG. 5, in accordance to an embodiment of the invention.

The embodiment follows the description above to FIGS. 2g and 2h. As in the previous embodiment, a dummy fill material 105 fills the trenches forming the dummy filled trenches 100 (FIG. 4a). As next illustrated in FIG. 4b, the overfill of the dummy fill material 105 is etched and planarized by an RIE etch process to form a fill-plug in the etched trenches 100. Subsequent steps follow as in the prior embodiments. For example, in FIG. 4c, the first ARC layer 70 is deposited over the sacrificial material layer 60, followed by deposition of the first photo resist 80. The first photo resist 80 is patterned (FIG. 4d) followed by formation of the via trench 77.

Figure 6A:
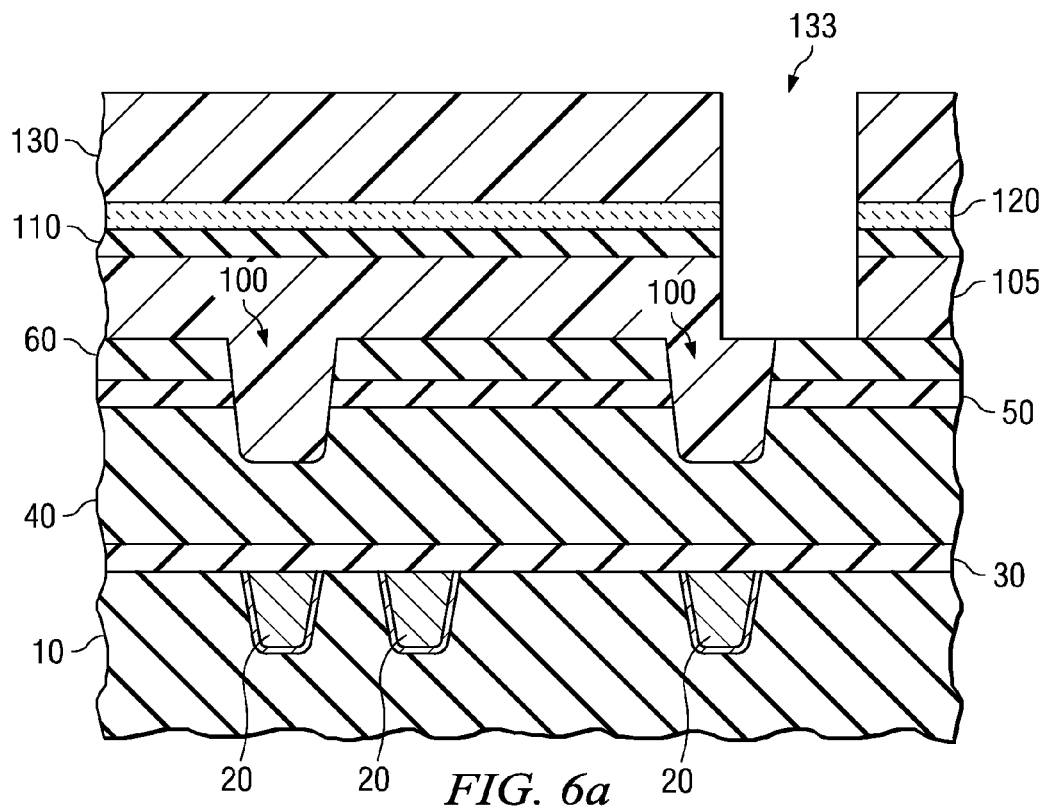
FIGS. 6*a*-6*c*, illustrates an application of the method, in accordance with an embodiment of the invention.
Figure 6B:
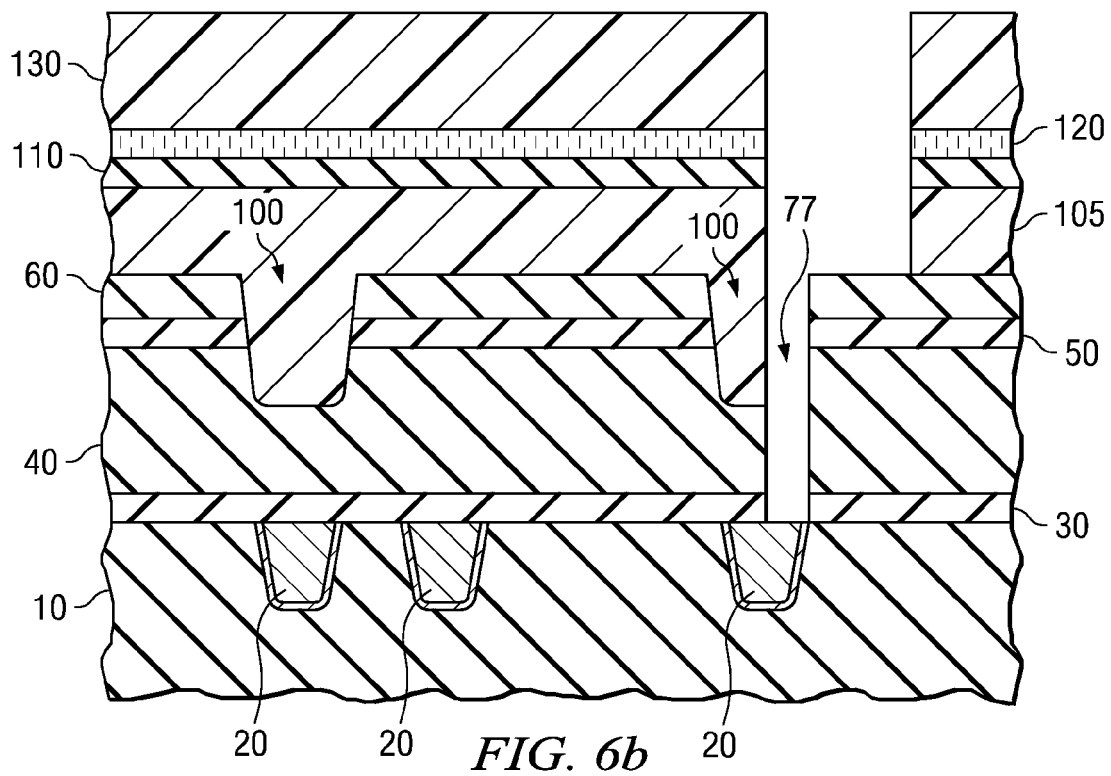
Figure 6C:
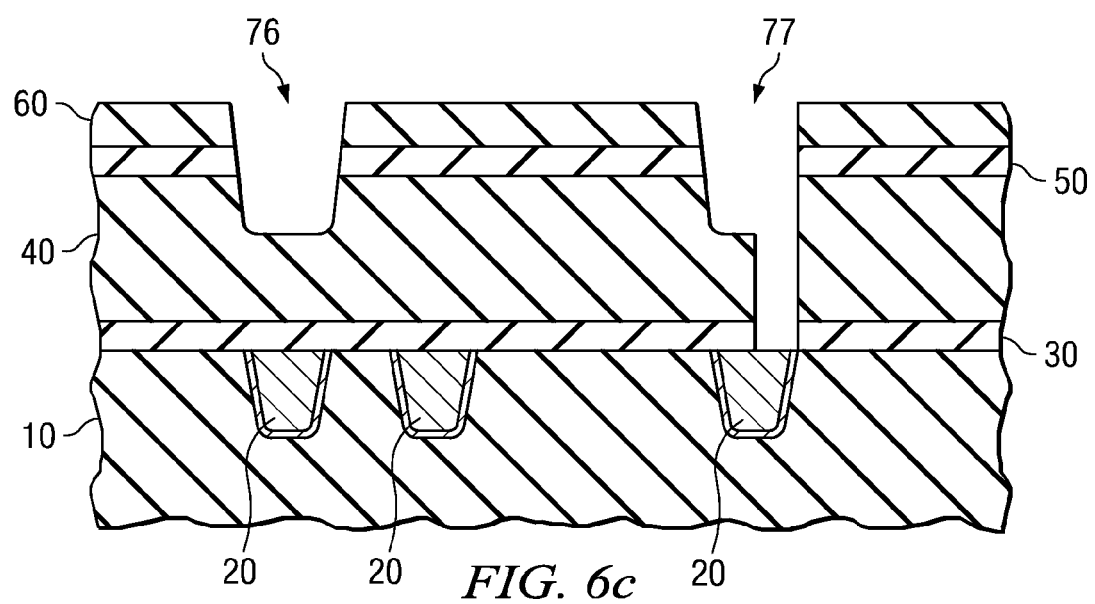

FIG. 6, which includes FIGS. 6a-6c, illustrates an application of the method to minimize misalignment between metal lines and via mask levels, in accordance with an embodiment of the invention.

Referring to FIG. 6a, the photo resist 80 is patterned as described in FIG. 2c. However, due to a misalignment between the via mask 140 and the metal line mask 90, the photo resist pattern 133 is misaligned with the dummy filled trench 100. As described in illustrating FIG. 2m, the anisotropic etch for forming the via trench 77 does not etch through the sacrificial material layer 60. Consequently, the etch proceeds by etching the regions with higher selectivity (dummy material layer 105) as illustrated in FIG. 6b. Hence, despite the misalignment between the metal line and via masks 90 and 140, the misalignment between the metal lines and vias maybe reduced (FIG. 6c).

Figure 7A:
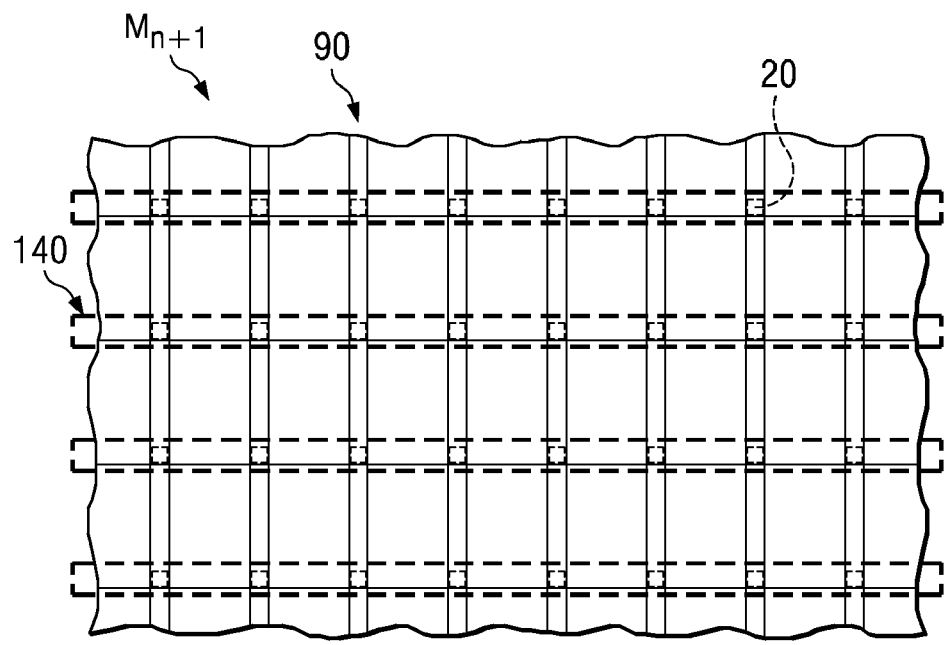
FIGS. 7*a* and 7*b*, illustrates an application of the method using via masks comprising lines, in accordance with an embodiment of the invention.
Figure 7B:
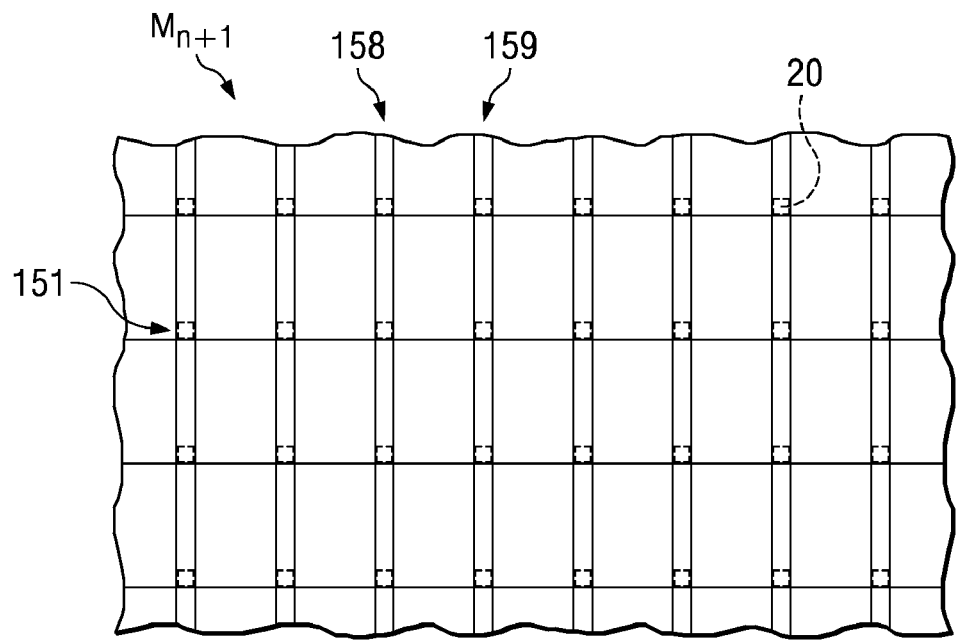

An embodiment of the invention illustrating a via mask used in the fabrication of the vias and metal lines is illustrated in FIG. 7, which includes FIGS. 7a and 7b.

The via mask design may comprise different shapes, unlike a conventional via mask. This is because, despite the larger size of the via mask, the vias are etched only in regions that overlie the metal mask. As illustrated in FIG. 7a, the metal line mask 90 and the via mask 140 are aligned perpendicularly. Further, the via mask 140 comprises a stripe, and in different embodiments, may comprise other shapes. For example, the via mask may comprise a line, a square, a circle, or any other suitable shape. In various embodiments of the invention, the vias are patterned only in the regions common to both the metal line mask 90 and the via mask 140. Hence, as next illustrated in FIG. 7b, the vias (e.g., via 151) are formed only over the first metal line 20 and connect the first metal line 20 to the metal lines in the $M_{n+1}$ metal level.

Figure 8A:
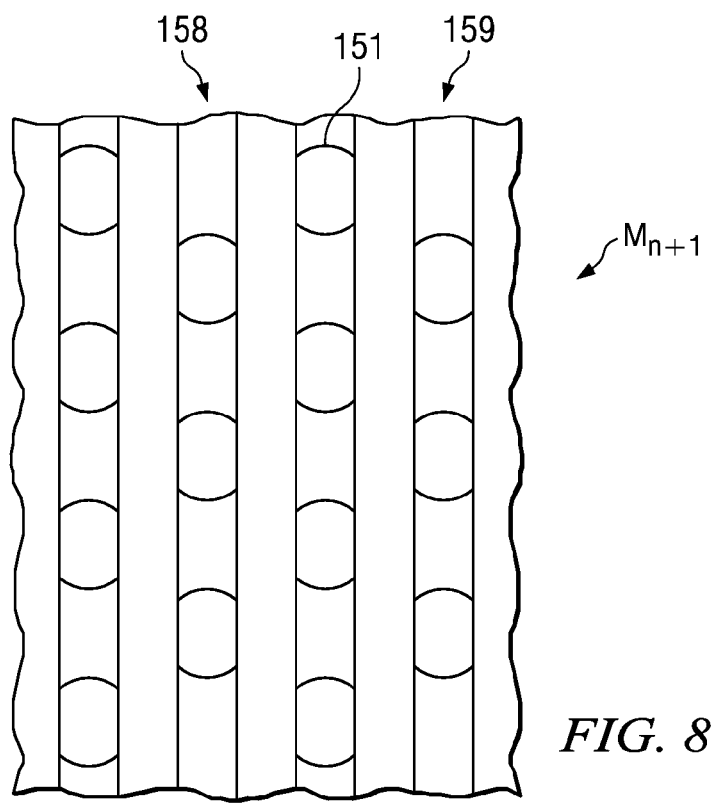
Figure 8B:
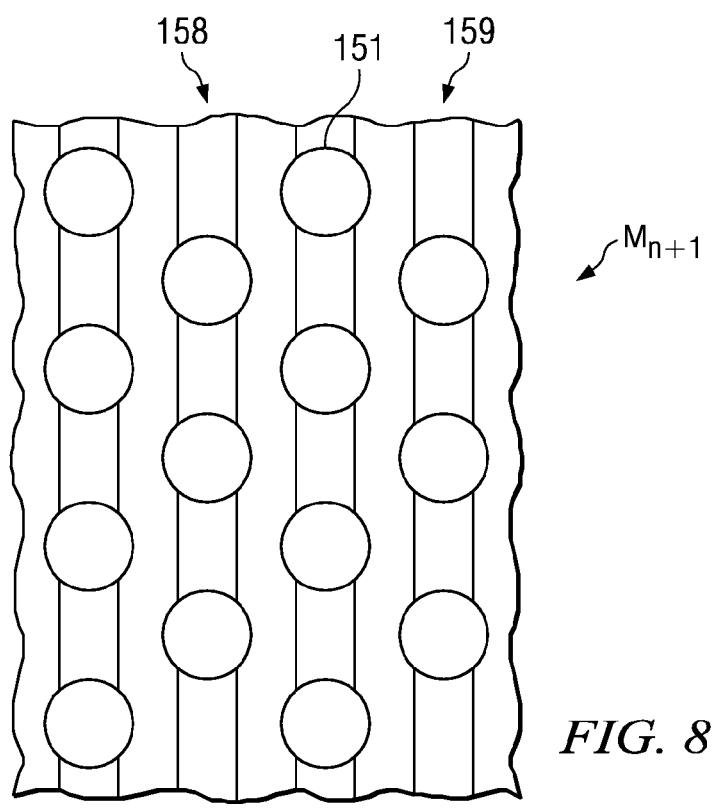
FIG. 8*b* illustrates a metal level fabricated with conventional processes.

FIG. 8 illustrates a top view of a metal level, wherein FIG. 8a illustrates the top view of a metal level fabricated using embodiments of the invention, and FIG. 8b illustrates a metal level fabricated with conventional processes.

Referring to FIG. 8a, the metal lines (for example, second and third metal lines 158 and 159) comprise a top critical dimension (width) that is constant across the metal level. Metal lines in regions overlying vias 151 are printed and formed at the same width. Also the top surface of the vias 151 and the bottom surface of the metal line comprise the same width. Hence, in various embodiments of the invention, vias have a circular or arc shape on two sides but a linear shape on the other two. However, in metal levels formed with conventional processes the top surface of the via is wider than the bottom surface of the metal line where the metal line is above the vias (FIG. 8b). Also, vias formed using conventional processing comprise a circular or oval shape.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor component, the method comprising:
   depositing an insulating layer over a metal level;
   depositing an etch stop layer over the insulating layer;
   depositing a sacrificial material layer over the etch stop layer;
   forming trenches for metal lines in the insulating layer by patterning the sacrificial material layer and the insulating layer;
   depositing a dummy fill material into the metal line trenches, wherein the dummy fill material forms an overfill layer above a surface of the sacrificial material layer;
   forming dummy fill-plugs by removing the overfill layer;
   using a via mask to expose a portion of a top surface of the dummy fill material and a portion of the sacrificial material layer;
   forming via openings by removing the exposed portion of the dummy fill material and the underlying insulating layer, wherein the portion of the sacrificial material layer protects underlying portions of the etch stop layer from being removed when forming the via openings;
   removing the dummy fill material from the metal line trenches;
   filling the via openings and the metal line trenches with a conductive material to form vias and metal lines, wherein a bottommost critical dimension (CD) of the metal lines overlying the vias is the same as a topmost CD of the vias; and
   removing the sacrificial material layer after filling the via openings and the metal line trenches.

2. The method of claim 1, wherein forming the via openings comprises etching with an etch rate, wherein an etch rate of the sacrificial material layer is less than an etch rate of the insulating layer.

3. The method of claim 1, wherein the conductive material comprises copper.

4. The method of claim 1, wherein the sacrificial material layer comprises a material selected from a group consisting of TiCN, NbCN, HfCN, and TaNC.

5. The method of claim 1, wherein the insulating layer comprises $SiO_2$, FSG, low-k or porous low-k dielectric.

6. The method of claim 1, wherein the sacrificial material layer comprises a first sacrificial film disposed below a second sacrificial film, the first sacrificial film comprising a dielectric material and the second sacrificial film comprising a metallic material.

7. The method of claim 1, wherein the sacrificial material layer comprises a material selected from the group consisting of TiW, TaSiN, and HfSiN.

8. The method of claim 1, wherein the sacrificial material layer comprises a material selected from the group consisting of TiN, TiSiN, and TaN.

9. The method of claim 1, wherein the dummy fill material is a different material from the sacrificial material layer.

10. A method of making a semiconductor component, the method comprising:
   depositing an insulating layer over a metal level;
   depositing an etch stop layer over the insulating layer;
   depositing a sacrificial material layer over the etch stop layer;
   forming trenches for metal lines in the insulating layer by patterning the sacrificial material layer and the insulating layer;
   filling the trenches for the metal lines with a dummy fill material;
   forming a patterned mask layer over the dummy fill material, wherein forming the patterned mask layer exposes a portion of the sacrificial material layer;
   using the patterned mask layer as a mask to etch a via opening by removing the dummy fill material and the underlying insulating layer, wherein the portion of the sacrificial material layer protects an underlying portion of the etch stop layer from being removed when forming the via opening;
   etching the patterned mask layer and the patterned dummy fill material to expose a bottom surface of the trenches for the metal lines;
   forming metal lines and vias by filling the via opening and metal line trenches with a conductive material, wherein a bottom critical dimension (CD) of the metal lines overlying the vias is the same as a top CD of the vias, wherein the bottom CD is measured at a bottom surface of the metal lines, wherein the top CD is measured at a top surface of the vias, and wherein the bottom surface of the metal lines contacts the top surface of the vias; and
   removing the sacrificial material layer.

11. The method of claim 10, wherein the sacrificial material layer comprises TiN or TaN.

12. The method of claim 10, wherein the sacrificial material layer comprises a material selected from a group consisting of V, Pr, Dy, Sr, and Gd.

13. The method of claim 10, wherein the sacrificial material layer comprises a material selected from a group consisting of Mo, Ta, and Ti.

14. A dual damascene process, the process comprising:
   forming a first metal level;
   after forming the first metal level, depositing an insulating layer over the first metal level;
   depositing an etch stop layer over the insulating layer;
   depositing a sacrificial material layer over the etch stop layer;
   after depositing the sacrificial material layer, forming metal line trenches in a second metal level, the second metal level disposed above the first metal level, the metal line trenches formed in a top portion of the second metal level;
   filling the metal line trenches with a dummy fill material;
   forming a etch mask for forming a via opening by exposing the dummy fill material and a portion of the sacrificial material layer;
   using the etch mask, etching the via opening for connecting the first metal level to the metal line trenches in the second metal level, wherein the via opening is etched only in a portion of regions underlying the metal line trenches, and wherein the portion of the sacrificial material layer protects an underlying portion of the etch stop layer from being removed when etching the via opening;
   forming metal lines and a via by filling the metal line trenches and the via opening with a conductive material, wherein a bottom critical dimension (CD) of a first metal line of the metal lines overlying the via is the same as a top CD of the via, wherein the bottom CD is measured at a bottom surface of the first metal line, wherein the top CD is measured at a top surface of the via, and wherein the bottom surface of the first metal line contacts the top surface of the via; and
   removing the sacrificial material layer.

15. The process of claim 14, wherein etching the via opening comprises etching with an etch rate, wherein an etch rate of the sacrificial material layer is less than an etch rate of the insulating layer.

16. The process of claim 14, wherein the sacrificial material layer comprises a material selected from a group consisting of NbCN, and HfCN.

17. The process of claim 14, wherein the sacrificial material layer comprises TiCN.

18. A method of a semiconductor device, the method comprising:
   depositing a etch stop layer over an insulating layer;
   depositing a sacrificial material layer over the etch stop layer;
   forming a trench in the insulating layer by etching the sacrificial material layer and the insulating layer;
   depositing a dummy fill material in the trench, wherein the dummy fill material forms an overfill layer above a surface of the sacrificial material layer;
   forming dummy fill-plugs by removing the overfill layer from above the sacrificial material layer;
   depositing a hard mask layer on the dummy fill-plugs;
   forming a etch mask for forming an opening by exposing the dummy fill-plugs and a portion of the sacrificial material layer;
   using the etch mask, etching the dummy fill material and the insulating layer to form an opening, wherein while etching the insulating layer an etch rate of the sacrificial material layer is less than an etch rate of the insulating layer, and wherein the portion of the sacrificial material layer protects an underlying portion of the etch stop layer from being removed when etching the via opening; and
   filling the opening to form a metal line and a via, wherein a bottommost critical dimension (CD) of the metal line overlying the via is the same as a topmost CD of the via.

19. The method of claim 18, wherein the ratio of the etch rate of the sacrificial material layer to the etch rate of the insulating layer is less than about 1:5.

20. The method of claim 18, wherein said dummy fill material is additionally deposited over a top surface of the sacrificial material layer.

21. The method of claim 18, wherein the sacrificial material layer comprises a material selected from a group consisting of TiWN, NbN, and MoSiN.

22. The method of claim 18, wherein the sacrificial material layer comprises MoN.

23. A method of forming metal lines and vias, the method comprising:
  depositing a etch stop layer over an insulating layer;
  depositing a sacrificial material layer over the etch stop layer;
  after depositing the sacrificial material layer, etching a metal line trench in the insulating layer using a metal line mask;
  filling the metal line trench with a dummy fill material different from the sacrificial material layer;
  using a via mask, forming a via pattern above the metal line trench, the via pattern having a critical dimension larger than a critical dimension of the metal line trench, wherein forming the via pattern exposes the dummy fill material and a portion of the sacrificial material layer;
  etching a via opening using the via pattern, wherein the via opening is etched only in regions common to both the metal line mask and the via mask, and wherein the portion of the sacrificial material lay protects an underlying portion of the etch stop layer from being removed when etching the via opening;
  filling the via opening to form a metal line and a via, wherein a bottom critical dimension (CD) of the metal line overlying the via is the same as a top CD of the via, wherein the bottom CD is measured at a bottom surface of the metal line, wherein the top CD is measured at a top surface of the via, and wherein the bottom surface of the metal line physically contacts the top surface of the via; and
  removing the sacrificial material layer.

24. The method of claim 23, wherein the via mask comprises patterns perpendicular to patterns on the metal line mask.

25. The method of claim 23, wherein the sacrificial material layer comprises NbCN.

26. The method of claim 23, wherein the sacrificial material layer comprises $WSi_2$.

* * * * *